(12) United States Patent
Aoki et al.

(10) Patent No.: US 9,064,574 B2
(45) Date of Patent: Jun. 23, 2015

(54) SEMICONDUCTOR DEVICE AND DRIVING METHOD THEREOF

(71) Applicant: Semiconductor Energy Laboratory Co., Ltd., Atsugi-shi, Kanagawa-ken (JP)

(72) Inventors: Takeshi Aoki, Kanagawa (JP); Takayuki Ikeda, Kanagawa (JP); Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/064,264

(22) Filed: Oct. 28, 2013

(65) Prior Publication Data
US 2014/0126271 A1    May 8, 2014

(30) Foreign Application Priority Data

Nov. 6, 2012   (JP) ................................. 2012-244560

(51) Int. Cl.
*G11C 7/08*    (2006.01)
*G11C 14/00*    (2006.01)

(52) U.S. Cl.
CPC ................... *G11C 14/0072* (2013.01)

(58) Field of Classification Search
CPC ..................................... G11C 7/08; G11C 7/06
USPC .................................................... 365/149, 205
See application file for complete search history.

(56) References Cited

U.S. PATENT DOCUMENTS

| | | |
|---|---|---|
| 3,775,693 A | 11/1973 | Proebsting |
| 4,797,576 A | 1/1989 | Asazawa |
| 4,800,303 A | 1/1989 | Graham et al. |
| 4,809,225 A | 2/1989 | Dimmler et al. |
| 5,039,883 A | 8/1991 | On |
| 5,473,571 A | 12/1995 | Shigematsu et al. |
| 5,731,856 A | 3/1998 | Kim et al. |
| 5,744,864 A | 4/1998 | Cillessen et al. |
| 5,936,879 A | 8/1999 | Brouwer et al. |
| 5,980,092 A | 11/1999 | Merryman et al. |
| 6,049,883 A | 4/2000 | Tjandrasuwita |
| 6,078,194 A | 6/2000 | Lee |

(Continued)

FOREIGN PATENT DOCUMENTS

EP    1 737 044 A1    12/2006
EP    2 226 847 A2    9/2010

(Continued)

OTHER PUBLICATIONS

International Search Report (Application No. PCT/JP2013/078633) dated Nov. 19, 2013, 2 pages.

(Continued)

*Primary Examiner* — Michael Tran
(74) *Attorney, Agent, or Firm* — Fish & Richardson P.C.

(57) ABSTRACT

To provide a semiconductor device in which power consumption can be reduced and operation delay due to a stop and a restart of supply of power supply voltage can be suppressed and a driving method thereof. A potential corresponding to data held in a period during which power supply voltage is continuously supplied is saved to a node connected to a capacitor before the supply of power supply voltage is stopped. By utilizing change of channel resistance of a transistor whose gate is the node, data is loaded when the supply of power supply voltage is restarted.

18 Claims, 10 Drawing Sheets

(56) References Cited

U.S. PATENT DOCUMENTS

| | | |
|---|---|---|
| 6,204,695 B1 | 3/2001 | Alfke et al. |
| 6,281,710 B1 | 8/2001 | Poirier et al. |
| 6,294,274 B1 | 9/2001 | Kawazoe et al. |
| 6,556,475 B2 | 4/2003 | Yamazaki et al. |
| 6,563,174 B2 | 5/2003 | Kawasaki et al. |
| 6,573,754 B2 | 6/2003 | Menczigar et al. |
| 6,693,616 B2 | 2/2004 | Koyama et al. |
| 6,727,522 B1 | 4/2004 | Kawasaki et al. |
| 6,738,281 B2 | 5/2004 | Yokozeki |
| 6,788,567 B2 | 9/2004 | Fujimori |
| 6,909,411 B1 | 6/2005 | Yamazaki et al. |
| 6,975,298 B2 | 12/2005 | Koyama et al. |
| 7,019,999 B1 * | 3/2006 | Srinivasan et al. ............ 365/49.1 |
| 7,031,189 B2 * | 4/2006 | Pascucci ................... 365/185.08 |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,076,748 B2 | 7/2006 | Kapoor et al. |
| 7,105,868 B2 | 9/2006 | Nause et al. |
| 7,151,511 B2 | 12/2006 | Koyama |
| 7,158,157 B2 | 1/2007 | Yamazaki et al. |
| 7,211,825 B2 | 5/2007 | Shih et al |
| 7,224,339 B2 | 5/2007 | Koyama et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,471,580 B2 | 12/2008 | Henzler et al. |
| 7,501,293 B2 | 3/2009 | Ito et al. |
| 7,557,801 B2 | 7/2009 | Ozaki |
| 7,576,582 B2 | 8/2009 | Lee et al. |
| 7,674,650 B2 | 3/2010 | Akimoto et al. |
| 7,696,952 B2 | 4/2010 | Kimura et al. |
| 7,732,819 B2 | 6/2010 | Akimoto et al. |
| 7,863,627 B2 | 1/2011 | Honda |
| 7,910,490 B2 | 3/2011 | Akimoto et al. |
| 7,932,521 B2 | 4/2011 | Akimoto et al. |
| 8,212,248 B2 | 7/2012 | Itagaki et al. |
| 8,274,077 B2 | 9/2012 | Akimoto et al. |
| 8,314,637 B2 | 11/2012 | Kato et al. |
| 8,362,538 B2 | 1/2013 | Koyama et al. |
| 8,368,066 B2 | 2/2013 | Yamazaki et al. |
| 8,410,838 B2 | 4/2013 | Kato et al. |
| 8,432,187 B2 | 4/2013 | Kato et al. |
| 8,446,171 B2 | 5/2013 | Takahashi |
| 8,605,490 B2 * | 12/2013 | Fackenthal .................. 365/154 |
| 8,619,464 B1 * | 12/2013 | Sinha et al. .................. 365/154 |
| 8,638,594 B1 * | 1/2014 | Sinha et al. .................. 365/156 |
| 8,792,275 B2 * | 7/2014 | Shih et al. ................. 365/185.07 |
| 8,817,536 B2 * | 8/2014 | Scade et al. .............. 365/185.08 |
| 2001/0046027 A1 | 11/2001 | Tai et al. |
| 2002/0036529 A1 | 3/2002 | Furusawa et al. |
| 2002/0056838 A1 | 5/2002 | Ogawa |
| 2002/0074568 A1 | 6/2002 | Yoshida et al. |
| 2002/0132454 A1 | 9/2002 | Ohtsu et al. |
| 2003/0076282 A1 | 4/2003 | Ikeda et al. |
| 2003/0122581 A1 | 7/2003 | Inoue et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0038582 A1 | 2/2006 | Peeters |
| 2006/0043377 A1 | 3/2006 | Hoffman et al. |
| 2006/0091793 A1 | 5/2006 | Baude et al. |
| 2006/0095975 A1 | 5/2006 | Yamada et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119394 A1 | 6/2006 | Dronavalli |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0019460 A1 | 1/2007 | Kang et al. |
| 2007/0024187 A1 | 2/2007 | Shin et al. |
| 2007/0024318 A1 | 2/2007 | Mamidipaka |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0126666 A1 | 6/2007 | Yamazaki et al. |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0048744 A1 | 2/2008 | Fukuoka |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0197414 A1 | 8/2008 | Hoffman et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308805 A1 | 12/2008 | Akimoto et al. |
| 2009/0002044 A1 | 1/2009 | Kobayashi |
| 2009/0008639 A1 | 1/2009 | Akimoto et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0019839 A1 | 1/2010 | Monden |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2011/0102018 A1 | 5/2011 | Shionoiri et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |

(56) References Cited

U.S. PATENT DOCUMENTS

| | | |
|---|---|---|
| 2011/0121878 A1 | 5/2011 | Kato et al. |
| 2011/0148463 A1 | 6/2011 | Kato et al. |
| 2011/0156024 A1 | 6/2011 | Koyama et al. |
| 2011/0163311 A1 | 7/2011 | Akimoto et al. |
| 2011/0176357 A1 | 7/2011 | Koyama et al. |
| 2011/0187410 A1 | 8/2011 | Kato et al. |
| 2011/0249487 A1 | 10/2011 | Saito et al. |
| 2012/0033510 A1 | 2/2012 | Nagatsuka et al. |
| 2012/0250397 A1 | 10/2012 | Ohmaru |
| 2012/0250407 A1 | 10/2012 | Kurokawa |
| 2012/0269013 A1 | 10/2012 | Matsuzaki |
| 2013/0057315 A1 | 3/2013 | Kato et al. |
| 2013/0127497 A1 | 5/2013 | Koyama |
| 2013/0135943 A1 | 5/2013 | Ohmaru |
| 2013/0222033 A1 | 8/2013 | Kato et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-110392 A | 4/1993 |
| JP | 05-251705 A | 9/1993 |
| JP | 08-264794 A | 10/1996 |
| JP | 10-078836 A | 3/1998 |
| JP | 11-505377 A | 5/1999 |
| JP | 2000-044236 A | 2/2000 |
| JP | 2000-077982 A | 3/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-050208 A | 2/2006 |
| WO | 2004/114391 A1 | 12/2004 |

OTHER PUBLICATIONS

Written Opinion (Application No. PCT/JP2013/078633) dated Nov. 19, 2013, 4 pages.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4S conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display with Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theorectical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorescent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductvity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4304-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDs," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID

(56) References Cited

OTHER PUBLICATIONS

Digest '09 : SID International Symposium Digest of Technical Papers, May 31, 2009, pp. 284-287.

Sanghun Jeon et al.; "180nm Gate Length Amorphous InGaZnO Thin Film Transistor for High Density Image Sensor Applications"; IEDM 10: Technical Digest of International Electron Devices Meeting; Dec. 6, 2010; pp. 504-507.

Ihun Song et al.; "Short Channel Characteristics of Gallium—Indium—Zinc—Oxide Thin Film Transistors for Three-Dimensional Stacking Memory"; IEEE Electron Device Letters; Jun. 1, 2008; pp. 549-552; vol. 29, No. 6.

Shunpei Yamazaki et al.; "Research, Development, and Application of Crystalline Oxide Semiconductor"; SID Digest '12 : SID International Symposium Digest of Technical Papers; Jun. 5, 2012; pp. 183-186.

Tatsuji Nishijima et al.; "Low-power Display System Driven by Utilizing Technique Using Crystalline IGZO Transistor"; SID Digest '12 : SID International Symposium Digest of Technical Papers; 2012; pp. 583-586.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Ki Chul Chun et al.; "A 3T Gain Cell Embedded DRAM Utilizing Preferential Boosting for High Density and Low Power On-Die Caches"; IEEE Journal of Solid-State Circuits; Jun. 1, 2011; pp. 1495-1505; vol. 46, No. 6.

T. Naito et al.; "World's first monolithic 3D-FPGA with TFT SRAM over 90nm 9 layer Cu CMOS"; 2010 Symposium on VLSI Technology : Digest of Technical Papers; Jun. 15, 2010; pp. 219-220.

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

\* cited by examiner

SEMICONDUCTOR DEVICE AND DRIVING METHOD THEREOF

TECHNICAL FIELD

The present invention relates to a semiconductor device and a driving method thereof. In particular, the present invention relates to a semiconductor device in which supply of power supply voltage is stopped as appropriate and a driving method thereof.

Note that in this specification, a semiconductor device means a device including a semiconductor element or a circuit including a semiconductor element.

BACKGROUND ART

A semiconductor device such as a programmable logic device (PLD) or a central processing unit (CPU) has a variety of configurations depending on its application. The semiconductor device generally includes a memory device; the PLD includes a register and a configuration memory, and the CPU includes a register and a cache memory.

These memory devices need to operate at higher speed in writing and reading data than a main memory generally using a DRAM. Thus, in many cases, a flip-flop is used as a register, and a static random access memory (SRAM) is used as a configuration memory and a cache memory.

The SRAM achieves high-speed operation with miniaturization of a transistor; however, there is a problem in that as the transistor is miniaturized, an increase in leakage current became obvious and thus, power consumption is increased. In order to reduce power consumption, an attempt has been made to stop supply of power supply voltage to a semiconductor device in a period during which data is not input or output, for example.

However, a flip-flop used as a register and an SRAM used as a cache memory are volatile memory devices. Therefore, in the case where supply of power supply voltage to a semiconductor device is stopped, data which has been lost in a volatile memory device such as a register or a cache memory need to be restored after the supply of power supply voltage is restarted.

In view of this, a semiconductor device in which a nonvolatile memory device is located in the periphery of a volatile memory device has been developed. For example, Patent Document 1 discloses the following technique: data held in a flip-flop or the like is stored in a ferroelectric memory before supply of power supply voltage is stopped, and the data stored in the ferroelectric memory is restored to the flip-flop or the like after the supply of power supply voltage is restarted.

REFERENCE

Patent Document

[Patent Document 1] Japanese Published Patent Application No. H10-078836

DISCLOSURE OF INVENTION

An object of one embodiment of the present invention is to provide a novel semiconductor device and a driving method thereof.

Specifically, an object of one embodiment of the present invention is to provide a semiconductor device in which power consumption can be reduced and a driving method thereof. Another object of one embodiment of the present invention is to provide a semiconductor device in which operation delay due to a stop and a restart of supply of power supply voltage can be suppressed and a driving method thereof.

In one embodiment of the present invention, a potential corresponding to data held in a period during which power supply voltage is continuously supplied is saved to a node connected to a capacitor before the supply of power supply voltage is stopped. By utilizing change in channel resistance of a transistor whose gate is the node, data is loaded in accordance with a restart of the supply of power supply voltage.

One embodiment of the present invention is a semiconductor device including a first memory circuit portion and a second memory circuit portion. The first memory circuit portion includes a first node holding one of a first potential and a second potential and a second node holding the other of the first potential and the second potential. The second memory circuit portion includes a first transistor in which a gate of the first transistor is electrically connected to a wiring to which a first control signal is input, one of a source and a drain of the first transistor is electrically connected to the first node, and the other of the source and the drain of the first transistor is electrically connected to a third node; a first capacitor in which one of electrodes of the first capacitor is electrically connected to the third node and the other of the electrodes of the first capacitor is electrically connected to a wiring to which the second potential is supplied; a second transistor in which a gate of the second transistor is electrically connected to the third node and one of a source and a drain of the second transistor is electrically connected to the wiring to which the second potential is supplied; and a third transistor in which a gate of the third transistor is electrically connected to a wiring to which a second control signal is input, one of a source and a drain of the third transistor is electrically connected to the other of the source and the drain of the second transistor, and the other of the source and the drain of the third transistor is electrically connected to the second node. The first transistor includes a semiconductor film including an oxide semiconductor.

A semiconductor device includes a first memory circuit portion and a second memory circuit portion. The first memory circuit portion includes a first node holding one of a first potential and a second potential and a second node holding the other of the first potential and the second potential. The second memory circuit portion includes a first inverter circuit in which an input terminal of the first inverter circuit is electrically connected to the first node; a first transistor in which a gate of the first transistor is electrically connected to a wiring to which a first control signal is input, one of a source and a drain of the first transistor is electrically connected to an output terminal of the first inverter circuit, and the other of the source and the drain of the first transistor is electrically connected to a third node; a first capacitor in which one of electrodes of the first capacitor is electrically connected to the third node and the other of the electrodes of the first capacitor is electrically connected to a wiring to which the second potential is supplied; a second transistor in which a gate of the second transistor is electrically connected to the third node and one of a source and a drain of the second transistor is electrically connected to the wiring to which the second potential is supplied; and a third transistor in which a gate of the third transistor is electrically connected to a wiring to which a second control signal is input, one of a source and a drain of the third transistor is electrically connected to the other of the source and the drain of the second transistor, and the other of the source and the drain is electrically connected to the first node. The first transistor includes a semiconductor film including an oxide semiconductor.

A semiconductor device includes a first memory circuit portion and a second memory circuit portion. The first memory circuit portion includes a first node holding one of a first potential and a second potential and a second node holding the other of the first potential and the second potential. The second memory circuit portion includes a first transistor in which a gate of the first transistor is electrically connected to a wiring to which a first control signal is input, one of a source and a drain of the first transistor is electrically connected to the first node, and the other of the source and the drain of the first transistor is electrically connected to a third node; a first capacitor in which one of electrodes of the first capacitor is electrically connected to the third node and the other of the electrodes of the first capacitor is electrically connected to a wiring to which the second potential is supplied; a second transistor in which a gate of the second transistor is electrically connected to the third node and one of a source and a drain of the second transistor is electrically connected to the wiring to which the second potential is supplied; a third transistor in which a gate of the third transistor is electrically connected to a wiring to which a second control signal is input, one of a source and a drain of the third transistor is electrically connected to the other of the source and the drain of the second transistor, and the other of the source and the drain of the third transistor is electrically connected to the second node; a fourth transistor in which a gate of the fourth transistor is electrically connected to the wiring to which the first control signal is input, one of a source and a drain of the fourth transistor is electrically connected to the second node, and the other of the source and the drain of the fourth transistor is electrically connected to a fourth node; a second capacitor in which one of electrodes of the second capacitor is electrically connected to the fourth node and the other of the electrodes of the second capacitor is electrically connected to the wiring to which the second potential is supplied; a fifth transistor in which a gate of the fifth transistor is electrically connected to the fourth node and one of a source and a drain of the fifth transistor is electrically connected to the wiring to which the second potential is supplied; and a sixth transistor in which a gate of the sixth transistor is electrically connected to the wiring to which the second control signal is input, one of a source and a drain of the sixth transistor is electrically connected to the other of the source and the drain of the fifth transistor, and the other of the source and the drain of the sixth transistor is electrically connected to the first node. The first transistor and the fourth transistor each include a semiconductor film including an oxide semiconductor.

A semiconductor device includes a first memory circuit portion and a second memory circuit portion. The first memory circuit portion includes a first node holding one of a first potential and a second potential and a second node holding the other of the first potential and the second potential. The second memory circuit portion includes a first inverter circuit in which an input terminal of the first inverter circuit is electrically connected to the first node; a first transistor in which a gate of the first transistor is electrically connected to a wiring to which a first control signal is input, one of a source and a drain of the first transistor is electrically connected to an output terminal of the first inverter circuit, and the other of the source and the drain of the first transistor is electrically connected to a third node; a first capacitor in which one of electrodes of the first capacitor is electrically connected to the third node and the other of the electrodes of the first capacitor is electrically connected to a wiring to which the second potential is supplied; a second transistor in which a gate of the second transistor is electrically connected to the third node and one of a source and a drain of the second transistor is electrically connected to the wiring to which the second potential is supplied; a third transistor in which a gate of the third transistor is electrically connected to a wiring to which a second control signal is input, one of a source and a drain of the third transistor is electrically connected to the other of the source and the drain of the second transistor, and the other of the source and the drain of the third transistor is electrically connected to the first node; a second inverter circuit in which an input terminal of the second inverter circuit is electrically connected to the second node; a fourth transistor in which a gate of the fourth transistor is electrically connected to the wiring to which the first control signal is input, one of a source and a drain of the fourth transistor is electrically connected to an output terminal of the second inverter circuit, and the other of the source and the drain of the fourth transistor is electrically connected to a fourth node; a second capacitor in which one of electrodes of the second capacitor is electrically connected to the fourth node and the other of the electrodes of the second capacitor is electrically connected to the wiring to which the second potential is supplied; a fifth transistor in which a gate of the fifth transistor is electrically connected to the fourth node and one of a source and a drain of the fifth transistor is electrically connected to the wiring to which the second potential is supplied; and a sixth transistor in which a gate of the sixth transistor is electrically connected to the wiring to which the second control signal is input, one of a source and a drain of the sixth transistor is electrically connected to the other of the source and the drain of the fifth transistor, and the other of the source and the drain of the sixth transistor is electrically connected to the second node. The first transistor and the fourth transistor each include a semiconductor film including an oxide semiconductor.

The semiconductor device of one embodiment of the present invention preferably includes the first memory circuit portion which holds the one of the first potential and the second potential in the first node and the other of the first potential and the second potential in the second node in a period during which power supply voltage is continuously supplied, and the second memory circuit portion which holds the one of the first potential and the second potential in the first node in the third node, and the other of the first potential and the second potential in the second node in the fourth node in a period during which the supply of power supply voltage is stopped.

In the semiconductor device of one embodiment of the present invention, it is preferable that the first control signal be a signal for switching between electrical conduction and non-conduction between the first node and the third node and switching between electrical conduction and non-conduction between the second node and the fourth node, and the second control signal be a signal for switching between electrical conduction and non-conduction between the second node and the other of the source and the drain of the second transistor and switching between electrical conduction and non-conduction between the first node and the other of the source and the drain of the fifth transistor.

In the semiconductor device of one embodiment of the present invention, it is preferable that the first control signal be a signal for switching between electrical conduction and non-conduction between the first node and the third node and switching between electrical conduction and non-conduction between the second node and the fourth node, and the second control signal be a signal for switching between electrical conduction and non-conduction between the first node and the other of the source and the drain of the second transistor and switching between electrical conduction and non-conduction between the second node and the other of the source and the drain of the fifth transistor.

A method for driving the semiconductor device preferably includes a first step of holding a potential held in the first node and a potential held in the second node, in the third node and the fourth node, respectively, by the first control signal; a second step of stopping supply of power supply voltage; a third step of restarting the supply of power supply voltage; and a fourth step of loading the potential held in the first node and the potential held in the second node to a state of the first step in accordance with the potential held in the third node and the potential held in the fourth node, by the second control signal.

Supply of power supply voltage to a semiconductor device of one embodiment of the present invention is stopped as appropriate, so that power consumption of the semiconductor device can be reduced. Further, data is saved before the supply of power supply voltage is stopped and is loaded after the supply of power supply voltage is restarted, so that operation delay can be prevented.

BEST MODE FOR CARRYING OUT THE INVENTION

Figure 1:
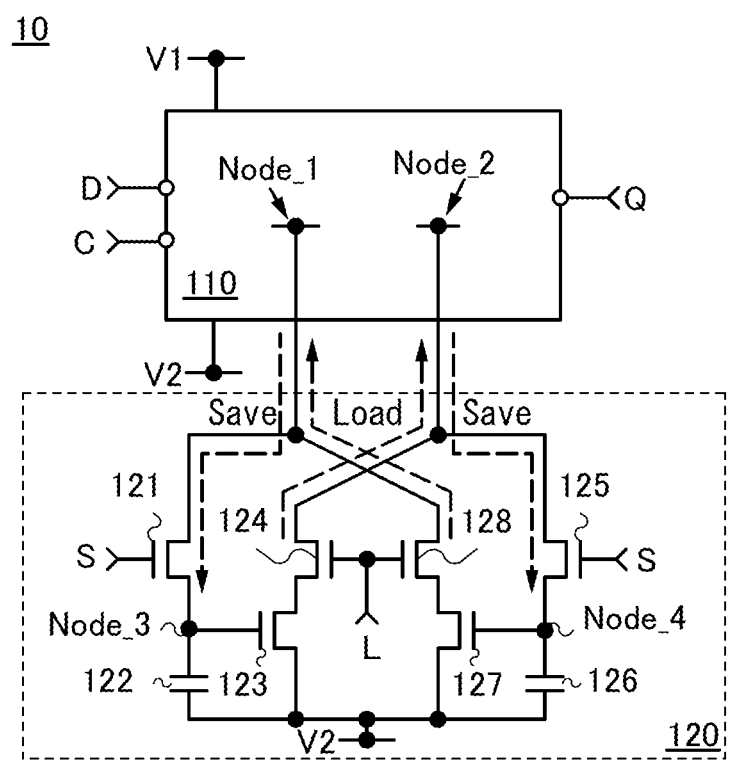
FIG. 1 is a circuit diagram of a semiconductor device.

Embodiments will be described below with reference to the drawings. Note that the embodiments can be implemented in various different ways and it will be readily appreciated by those skilled in the art that modes and details of the embodiments can be changed in various ways without departing from the spirit and scope of the present invention. The present invention therefore should not be construed as being limited to the following description of the embodiments.

In the drawings, the size, the layer thickness, or the region is exaggerated for clarity in some cases. Thus, embodiments of the present invention are not limited to such scales. Note that the drawings are schematic views showing ideal examples, and embodiments of the present invention are not limited to shapes or values shown in the drawings. For example, the following can be included: variation in signal, voltage, or current due to noise or difference in timing.

In this specification and the like, a transistor is an element having at least three terminals: a gate, a drain, and a source. The transistor includes a channel region between the drain (a drain terminal, a drain region, or a drain electrode) and the source (a source terminal, a source region, or a source electrode) and current can flow through the drain, the channel region, and the source.

Here, since the source and the drain of the transistor change depending on the structure, the operating condition, and the like of the transistor, it is difficult to define which is a source or a drain. Thus, a portion that functions as a source or a portion that functions as a drain is not referred to as a source or a drain in some cases. In that case, one of the source and the drain might be referred to as a first electrode, and the other of the source and the drain might be referred to as a second electrode.

Note that in this specification, ordinal numbers such as "first", "second", and "third" are used in order to avoid confusion among components, and thus do not limit the number of the components.

Note that in this specification, the expression "A and B are connected" means the case where "A and B are electrically connected" in addition to the case where "A and B are directly connected". Here, the expression "A and B are electrically connected" means the case where electric signals can be transmitted and received between A and B when an object having any electric action exists between A and B.

Note that in this specification, terms for describing arrangement, such as "over" and "under", are used for convenience for describing the positional relation between components with reference to drawings. Further, the positional relation between components is changed as appropriate in accordance with a direction in which each component is described. Thus, there is no limitation on terms used in this specification, and description can be made appropriately depending on the situation.

Note that the positional relations of circuit blocks in block diagrams are specified for description, and even in the case where different circuit blocks have different functions, the different circuit blocks might be provided in an actual circuit or an actual region so that different functions are achieved in the same circuit or the same region. The functions of circuit blocks in block diagrams are specified for description, and even in the case where one circuit block is illustrated, blocks might be provided in an actual circuit or an actual region so that processing performed by one circuit block is performed by a plurality of circuit blocks.

Embodiment 1

This embodiment is described with reference to drawings in the following order:

1. Circuit Diagram of Semiconductor Device 1-1. Connection Relation between Elements of Semiconductor Device 1-2. Features of Oxide Semiconductor Transistor 2. Operation of Semiconductor Device 3. Modification Example of Semiconductor Device 4. Application Examples of Semiconductor Device 4-1. Examples of Application to Flip-flop in PLD 4-1-1. Structure Example of PLD and LE 4-1-2. Structure Examples of Configuration Memory 4-2. Examples of Application to Register in CPU 5. Structure Example of Semiconductor Device 6. Action and Effect of Semiconductor Device Disclosed in this Specification.

1. Circuit Diagram of Semiconductor Device

First, a circuit diagram of a semiconductor device is described.

1-1. Connection Relation of Semiconductor Device in Circuit Diagram

FIG. 1 is a circuit diagram of a semiconductor device of an embodiment of the present invention. A semiconductor device 10 in FIG. 1 can be roughly divided into a memory circuit portion 110 (also referred to as a first memory circuit portion) and a memory circuit portion 120 (also referred to as a second memory circuit portion).

The memory circuit portion 110 in FIG. 1 can hold a potential corresponding to data in a period during which power supply voltage is continuously supplied.

The memory circuit portion 110 includes a node Node_1 and a node Node_2 capable of holding potentials corresponding to 1 and 0 as data in a period during which power supply voltage is continuously supplied. The memory circuit portion 110 is supplied with a potential V1 and a potential V2 (V1>V2). These potentials V1 and V2 are supplied as power supply voltage for the memory circuit portion 110.

As an example, the potential V1 is a high power supply potential VDD and the potential V2 is a low power supply potential VSS. The potential V2 may be a ground potential GND.

Note that here, "data "1" is held in the node Node_1 or Node_2" means that the potential of the node Node_1 or Node_2 is the potential V1. In addition, "data "0" is held in the node Node_1 or Node_2" means that the potential of the node Node_1 or Node_2 is the potential V2. As described above, the potential V1 is higher than the potential V2. Thus, a potential held in the node Node_1 or Node_2 based on the potential V1 may be referred to as a potential at a H level, and a potential held in the node Node_1 or Node_2 based on the potential V2 may be referred to as a potential at an L level.

Potentials held in the nodes Node_1 and Node_2 are signals inverted from each other. In other words, the node Node_1 holds a potential at one of the H level and the L level and the node Node_2 holds a potential at the other of the H level and the L level.

Potentials at the H level and the L level change in accordance with a data signal D and a clock signal C which are input to the memory circuit portion 110 in a period during which power supply voltage is continuously supplied. The potentials held in the nodes Node_1 and Node_2 are output as an output signal Q in a period during which power supply voltage is continuously supplied.

An inverted clock signal CB and/or a reset signal, or the like, in addition to the data signal D and the clock signal C, may be input to the memory circuit portion 110. Alternatively, an input clock signal may be a plurality of clock signals having different phases.

The memory circuit portion 110 includes a volatile register, a flip-flop, or a latch circuit. The memory circuit portion 110 can be any of a D register, a T register, a JK register, and an RS register depending on the kind of data to be applied when a register is used as the memory circuit portion 110.

Potentials held in the nodes Node_1 and Node_2 are saved to the memory circuit portion 120 before the supply of power supply voltage is stopped (a dotted arrow Save in the drawing). The potentials saved to the memory circuit portion 120 are loaded into the memory circuit portion 110 after the supply of power supply voltage is restarted. Note that the potentials held in the nodes Node_1 and Node_2 in the memory circuit portion 110 are lost when the supply of power supply voltage is stopped.

"Stop of supply of power supply voltage to the semiconductor device 10" or "supply of power supply voltage to the semiconductor device 10 is stopped" means that the potential of a wiring to which the potential V1 is supplied is switched from the potential V1 to the potential V2 and thus a potential difference between the potential V1 and the potential V2 (V1−V2) is switched to 0. Alternatively, "stop of supply of power supply voltage to the semiconductor device 10" or "supply of power supply voltage to the semiconductor device 10 is stopped" may mean that a switch provided between the memory circuit portion 110 and a wiring to which the potential V1 is supplied is turned off from an on state.

"Restart of supply of power supply voltage to the semiconductor device 10" or "supply of power supply voltage to the semiconductor device 10 is restarted" means that the potential of the wiring to which the potential V1 is supplied is switched from the potential V2 to the potential V1 so that the potential difference between the potential V1 and the potential V2 (V1−V2) is switched from 0 to a value exceeding 0. Alternatively, "restart of supply of power supply voltage to the semiconductor device 10" or "supply of power supply voltage to the semiconductor device 10 is restarted" may mean that a switch provided between the memory circuit portion 110 and the wiring to which the potential V1 is supplied is turned on from an off state.

"Power supply voltage is continuously supplied to the semiconductor device 10" means that the potential V1 is continuously supplied by holding the potential of the wiring to which the potential V1 is supplied at the potential V1 so that the potential difference between the potential V1 and the potential V2 (V1−V2) becomes a value exceeding 0. Alternatively, "power supply voltage is continuously supplied to the semiconductor device 10" may mean that a switch provided between the memory circuit portion 110 and the wiring to which the potential V1 is supplied is kept on.

The memory circuit portion 120 in FIG. 1 can hold a potential corresponding to data in the period during which the supply of power supply voltage is stopped.

The memory circuit portion 120 includes a transistor 121 (also referred to as a first transistor), a capacitor 122 (also referred to as a first capacitor), a transistor 123 (also referred to as a second transistor), a transistor 124 (also referred to as a third transistor), a transistor 125 (also referred to as a fourth transistor), a capacitor 126 (also referred to as a second capacitor), a transistor 127 (also referred to as a fifth transistor), and a transistor 128 (also referred to as a sixth transistor). Further, the memory circuit portion 120 includes a node Node_3 and a node Node_4 capable of holding potentials corresponding to 1 and 0 as data at least in the period during which the supply of power supply voltage is stopped.

The node Node_3 holds a potential at one of the H level and the L level of the node Node_1 at least in the period during which the supply of power supply voltage is stopped. The node Node_4 holds a potential at the other of the H level and the L level of the node Node_2 at least in the period during which the supply of power supply voltage is stopped.

A gate of the transistor 121 is connected to a wiring to which a control signal Save (denoted by S in the drawing) is input. One of a source and a drain of the transistor 121 is connected to the node Node_1. The other of the source and the drain of the transistor 121 is connected to the node Node_3. Note that description is made on the transistor 121 as an n-channel transistor, for example.

One of electrodes of the capacitor 122 is connected to the node Node_3. The other of the electrodes of the capacitor 122 is connected to a wiring to which the potential V2 is supplied. When the transistor 123 has high gate capacitance or the like, the capacitor 122 can be eliminated.

A gate of the transistor 123 is connected to the node Node_3. One of a source and a drain of the transistor 123 is connected to the wiring to which the potential V2 is supplied. Note that description is made on the transistor 123 as an n-channel transistor, for example.

A gate of the transistor 124 is connected to a wiring to which a control signal Load (denoted by L in the drawing) is input. One of a source and a drain of the transistor 124 is connected to the other of the source and the drain of the transistor 123. The other of the source and the drain of the transistor 124 is connected to the node Node_2. Note that description is made on the transistor 124 as an n-channel transistor, for example.

A gate of the transistor 125 is connected to the wiring to which the control signal Save is input. One of a source and a drain of the transistor 125 is connected to the node Node_2. The other of the source and the drain of the transistor 125 is connected to the node Node_4. Note that description is made on the transistor 125 as an n-channel transistor, for example.

One of electrodes of the capacitor 126 is connected to the node Node_4. The other of the electrodes of the capacitor 126 is connected to the wiring to which the potential V2 is supplied. When gate capacitance of the transistor 127 or the like is increased, the capacitor 126 can be eliminated.

A gate of the transistor 127 is connected to the node Node_4. One of a source and a drain of the transistor 127 is connected to the wiring to which the potential V2 is supplied. Note that description is made on the transistor 127 as an n-channel transistor, for example.

A gate of the transistor 128 is connected to the wiring to which the control signal Load is input. One of a source and a drain of the transistor 128 is connected to the other of the source and the drain of the transistor 127. The other of the source and the drain of the transistor 128 is connected to the node Node_1. Note that description is made on the transistor 128 as an n-channel transistor, for example.

The control signal Save is a signal for switching between conduction and non-conduction between the node Node_1 and the node Node_3. The control signal Save is also a signal for switching between conduction and non-conduction between the node Node_2 and the node Node_4. In the circuit configuration in FIG. 1, by the control signal Save at the H level, a channel between the nodes Node_1 and Node_3 and a channel between the nodes Node_2 and Node_4 are brought into conduction, and by the control signal Save at the L level, a channel between the nodes Node_1 and Node_3 and a channel between the nodes Node_2 and Node_4 are brought out of conduction.

When the control signal Save is switched to the H level, data of the nodes Node_1 and Node_2 in the memory circuit portion 110 can be saved to the nodes Node_3 and Node_4. When the control signal Save is switched to the L level, the nodes Node_3 and Node_4 can continuously hold data as potentials.

The control signal Load is a signal for switching between conduction and non-conduction between the node Node_2 and the other of the source and the drain of the transistor 123. The control signal Load is also a signal for switching between conduction and non-conduction between the node Node_1 and the other of the source and the drain of the transistor 127. In the circuit configuration in FIG. 1, by the control signal Load at the H level, a channel between the node Node_2 and the other of the source and the drain of the transistor 123 and a channel between the node Node_1 and the other of the source and the drain of the transistor 127 are brought into conduction, and by the control signal Load at the L level, a channel between the node Node_2 and the other of the source and the drain of the transistor 123 and a channel between the node Node_1 and the other of the source and the drain of the transistor 127 are brought out of conduction.

Data held as potentials in the nodes Node_3 and Node_4 in the memory circuit portion 120 in the period during which the supply of power supply voltage is stopped can be loaded into the nodes Node_1 and Node_2 in the memory circuit portion 110 by controlling the control signal Load after the supply of power supply voltage is restarted (a dotted arrow Load in the drawing).

As a specific example, the case where data "1" corresponding to the potential V1 held in the node Node_1 is saved to the node Node_3 before the supply of power supply voltage is stopped and data "0" corresponding to the potential V2 held in the node Node_2 is saved to the node Node_4 is described. Even when the supply of power supply voltage is stopped, the potential of the node Node_3 is kept at V1 and the potential of the node Node_4 is kept at V2; however, the potentials of the nodes Node_1 and Node_2 become undefined values.

Here, the transistor 123 has lower channel resistance than the transistor 127 because the potential of the gate of the transistor 123 (V1) is higher than the potential of the gate of transistor 127 (V2). Thus, in the case where the transistor 124 and the transistor 128 are turned on by setting the control signal Load at the H level, the potential of the other of the source and the drain of the transistor 124 connected to the node Node_2 is lower than the potential of the other of the source and the drain of the transistor 128 connected to the node Node_1. In the memory circuit portion 110, the transistor 124 and the transistor 128 are turned on; thus, the potential difference between the node Node_1 and the node Node_2 is generated.

After the supply of power supply voltage is restarted in the memory circuit portion 110, the node Node_2 and the node Node_1 can hold the potential V2 and the potential V1, respectively, by the potential difference. Data corresponding to these potentials corresponds to data at the time of being saved to the nodes Node_3 and Node_4 in the memory circuit portion 120 from the nodes Node_1 and Node_2 in the memory circuit portion 110, that is, just before the supply of power supply voltage is stopped.

As described above, data of the node Node_1 and the node Node_2 in the memory circuit portion 110 can be held as potentials held in the node Node_3 and the node Node_4 in the memory circuit portion 120 in this embodiment. The potential difference between the potentials held in the nodes Node_3 and Node_4 affects the difference of channel resistance between the transistors 123 and 127; thus, the potential difference can be generated at the nodes Node_1 and Node_2 in the memory circuit portion 110. The supply of power supply voltage to the memory circuit portion 110 is restarted, whereby data can be loaded into the memory circuit portion 110.

In the configuration of this embodiment, the potential at the H level of the control signal Save is a potential higher than the threshold voltage of the transistor 121 or 125. The potential at the L level of the control signal Save is a potential lower than the threshold voltage of the transistor 121 or 125. For example, the potential at the H level of the control signal Save may be the potential V1 and the potential at the L level of the control signal Save may be the potential V2. Note that in this configuration, potentials which are lower than the potentials V1 and V2 held in the nodes Node_1 and Node_2 by the threshold voltage of the transistor 121 or 125 are held in the nodes Node_3 and Node_4 as data. Therefore, a configuration is effective in which the potential at the H level of the control signal Save is set to a potential higher than the potential V1 in anticipation of the amount of potential decreased by the threshold voltage.

As described above, in the semiconductor device in this embodiment, data is loaded into the memory circuit portion 110 using the potential difference between the node Node_3 and the node Node_4. Therefore, when one of potentials of the nodes Node_3 and Node_4 is relatively high, data can be held in the memory circuit portion 120. Accordingly, even when potentials which are decreased by the threshold voltage of the transistor 121 or 125 are held in the node Node_3 or Node_4, data can be loaded into the memory circuit portion 110.

Further, in the configuration of this embodiment, even when charge held in the nodes Node_3 and Node_4 is decreased over time, it is possible to expand the acceptable range of decrease of charge, in which operation after data is saved can be accurately performed. For example, the potential V1 is held in the node Node_3 and the potential V2 is held in the node Node_4. In such a case, when charge is decreased and potentials are decreased from both of the nodes by $\Delta V$ as time passes, the node Node_3 has a potential $(V1-\Delta V)$. In the case where the potential V2 is a ground potential GND, the node Node_4 has the potential V2, and in the case where the potential V2 is lower than the ground potential GND, the node Node_4 has the potential $(V2+\Delta V)$. Even in such a case, in the configuration of this embodiment, when one of the nodes Node_3 and Node_4 holds a relatively high potential, operation after data is saved can be accurately performed. Accordingly, the length of time in which data is held in the memory circuit portion 120 is easily extended.

As described above, a potential of one of the nodes Node_3 and Node_4 is a relatively high potential in the semiconductor device of this embodiment; thus, it is not necessary to increase a potential at the H level of the control signal Save in advance, for example. Therefore, the number of voltage levels generated in a power supply circuit for supplying power supply voltage to the semiconductor device can be reduced and driving in which the amplitude of the control signal Save is decreased can be performed.

Note that the transistors 121 and 125 each are a transistor including an oxide semiconductor. A path for supplying charge to the nodes Node_3 and Node_4 is only a path through the source and the drain of the transistor including an oxide semiconductor. The transistor has an extremely low off-state current value. Therefore, in a period during which the transistor is off, the potentials of the nodes Node_3 and Node_4 can be kept substantially constant. For this reason, data can be held in the nodes Node_3 and Node_4 regardless of whether the power supply voltage is supplied. In other words, data held in the nodes Node_1 and Node_2 in the memory circuit portion 110 can be saved to nodes Node_3 and Node_4.

The transistor 123, the transistor 124, the transistor 127, and the transistor 128 can be formed using any of a variety of semiconductor materials. For example, a material such as silicon or germanium can be used. Alternatively, it is possible to use a compound semiconductor or an oxide semiconductor. Note that as the transistor 123, the transistor 124, the transistor 127, and the transistor 128, a transistor whose mobility is high (for example, a transistor in which a channel is formed in single crystal silicon) is preferably used.

In the above-described semiconductor device of this embodiment, the supply of power supply voltage can be stopped as appropriate by saving and loading data in the memory circuit portions 110 and 120. Thus, power consumption can be reduced.

Further, in the semiconductor device described in this embodiment, data saving in the memory circuit portions 110 and 120 can be controlled by turning on and turning off the transistors. Thus, operation delay is short compared with the case where data is saved to an external memory circuit portion. Further, a configuration can be used in which data saving is performed before the supply of power supply voltage is stopped and data is held in the memory circuit portion 110 in a period during which the power supply voltage is continuously supplied. Thus, in the period during which the power supply voltage is continuously supplied, data can be held at high speed, and operation delay can be suppressed.

1-2. Features of Oxide Semiconductor Transistor

Here, the features of a transistor including an oxide semiconductor are described.

In this embodiment, a material containing at least indium can be used as the oxide semiconductor. In particular, a material containing indium and zinc is preferably used. As a stabilizer for reducing variations in electric characteristics of the transistor, a material containing gallium in addition to indium and zinc is preferably used.

Alternatively, a material which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor.

As the oxide semiconductor, for example, any of the following oxides can be used: indium oxide, an In—Zn-based oxide, an In—Mg-based oxide, an In—Ga-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than In, Ga, and Zn.

A transistor including the above-described oxide semiconductor for a semiconductor layer is an n-channel transistor. Further, oxygen vacancies in the oxide semiconductor might generate carriers. This might degrade the electric characteristics and reliability of the transistor. For example, in some cases, the threshold voltage of the transistor is shifted in the negative direction, and drain current flows when gate voltage is 0 V. A transistor in which drain current flows when gate voltage is 0 V is referred to as a normally-on transistor, whereas a transistor in which substantially no drain current flows when gate voltage is 0 V is referred to as a normally-off transistor.

In view of the above, when an oxide semiconductor film is used, it is preferable that defects, typically oxygen vacancies in the oxide semiconductor film be reduced as much as possible. For example, it is preferable that the spin density of the oxide semiconductor film (the density of defects in the oxide semiconductor film) at a g-value of 1.93 in electron spin resonance spectroscopy in which a magnetic field is applied in parallel to the film surface be reduced to lower than or equal to the lower detection limit of measurement equipment. When the defects, typically the oxygen vacancies in the oxide semiconductor film are reduced as much as possible, the transistor can be prevented from being normally on, leading to an improvement in the electric characteristics and reliability of the transistor.

The shift of the threshold voltage of a transistor in the negative direction is caused in some cases by hydrogen (including a hydrogen compound such as water) contained in an oxide semiconductor film as well as by oxygen vacancies. Hydrogen contained in the oxide semiconductor film reacts with oxygen bonded to a metal atom to be water and forms vacancies (also referred to as oxygen vacancies) in a lattice from which oxygen is released (or a portion from which oxygen is released). In addition, part of hydrogen reacts with oxygen. This generates electrons serving as carriers. Thus, a transistor including an oxide semiconductor film that contains hydrogen is likely to be normally on.

Accordingly, it is preferable that hydrogen be reduced as much as possible in the oxide semiconductor film of the transistor. Specifically, the concentration of hydrogen in the oxide semiconductor film that is measured by secondary ion mass spectrometry (SIMS) is lower than $5 \times 10^{18}$ atoms/cm$^3$, preferably lower than or equal to $1 \times 10^{18}$ atoms/cm$^3$, more preferably lower than or equal to $5 \times 10^{17}$ atoms/cm$^3$, still more preferably lower than or equal to $1 \times 10^{16}$ atoms/cm$^3$.

Further, the concentration of an alkali metal or an alkaline earth metal in the oxide semiconductor film that is measured by SIMS is lower than or equal to $1 \times 10^{18}$ atoms/cm$^3$, preferably lower than or equal to $2 \times 10^{16}$ atoms/cm$^3$. When an alkali metal or an alkaline earth metal is bonded to an oxide semiconductor, carriers are generated in some cases. This might lead to an increase in off-state current of the transistor.

Further, when nitrogen is contained in the oxide semiconductor, electrons serving as carriers are generated and carrier density is increased, so that the oxide semiconductor film easily becomes n-type. As a result, a transistor including the oxide semiconductor film that contains nitrogen is likely to be normally on. For this reason, nitrogen in the oxide semiconductor film is preferably reduced as much as possible. The concentration of nitrogen is preferably, for example, lower than or equal to $5 \times 10^{18}$ atoms/cm$^3$.

Further, when a Group 14 element such as silicon and carbon is contained in the oxide semiconductor film, electrons serving as carriers are generated and carrier density is increased, so that the oxide semiconductor film easily becomes n-type. Thus, the concentration of silicon in the transistor including the oxide semiconductor film that is measured by SIMS is lower than or equal to $3 \times 10^{18}$ atoms/cm$^3$, preferably lower than or equal to $3 \times 10^{17}$ atoms/cm$^3$. Note that at an interface, the concentration of carbon that is measured by SIMS is lower than or equal to $3 \times 10^{18}$ atoms/cm$^3$, preferably lower than or equal to $3 \times 10^{17}$ atoms/cm$^3$.

As described above, when the oxide semiconductor film that is highly purified by reducing impurities (e.g., hydrogen, nitrogen, silicon, carbon, an alkali metal, and an alkaline earth metal) as much as possible is used, the transistor can be prevented from being normally on, so that the off-state current of the transistor can be significantly reduced. Note that the highly purified oxide semiconductor can be regarded as an intrinsic semiconductor or a substantially intrinsic semiconductor.

In addition, the transistor is an enhancement transistor, and the oxide semiconductor film is an oxide semiconductor film on which impurity addition treatment for increasing conductivity by intentionally increasing carrier density is not performed. Thus, the carrier density of the oxide semiconductor film is lower than or equal to $1 \times 10^{17}$/cm$^3$, lower than or equal to $1 \times 10^{16}$/cm$^3$, lower than or equal to $1 \times 10^{15}$/cm$^3$, lower than or equal to $1 \times 10^{14}$/cm$^3$, or lower than or equal to $1 \times 10^{13}$/cm$^3$.

Note that various experiments can prove low off-state current of a transistor including a highly-purified oxide semiconductor film. For example, even when an element has a channel width of $1 \times 10^6$ μm and a channel length L of 10 μm, off-state current can be lower than or equal to the measurement limit of a semiconductor parameter analyzer, i.e., lower than or equal to $1 \times 10^{-13}$ A, at a voltage (drain voltage) between a source electrode and a drain electrode of 1 to 10 V. In that case, it can be seen that off-state current corresponding to a value obtained by division of the off-state current by the channel width of the transistor is lower than or equal to 100 zA/μm. In addition, a storage capacitor and a transistor were connected to each other and off-state current was measured using a circuit in which charge flowing to or from the storage capacitor is controlled by the transistor. In the measurement, a highly-purified oxide semiconductor film was used in the channel formation region of the transistor, and the off-state current of the transistor was measured from a change in the amount of charge of the storage capacitor per unit hour. As a result, it can be seen that, in the case where the voltage between the source electrode and the drain electrode of the transistor is 3 V, a lower off-state current of several tens of yoctoamperes per micrometer is obtained. Accordingly, the transistor including the highly-purified oxide semiconductor film has an extremely low off-state current.

As described above, a transistor used as the transistors 121 and 125 for holding potentials of the nodes Node_3 and Node_4 included in the memory circuit portion 120 has a low off-state current when an oxide semiconductor is used for a semiconductor layer. When a transistor having a low off-state current is used, a change in potential corresponding to data that is caused by off-state current is small even when the data is held for a long time.

2. Operation of Semiconductor Device

An example of operation of the semiconductor device is described with reference to FIGS. 2A and 2B.

Figure 2A:
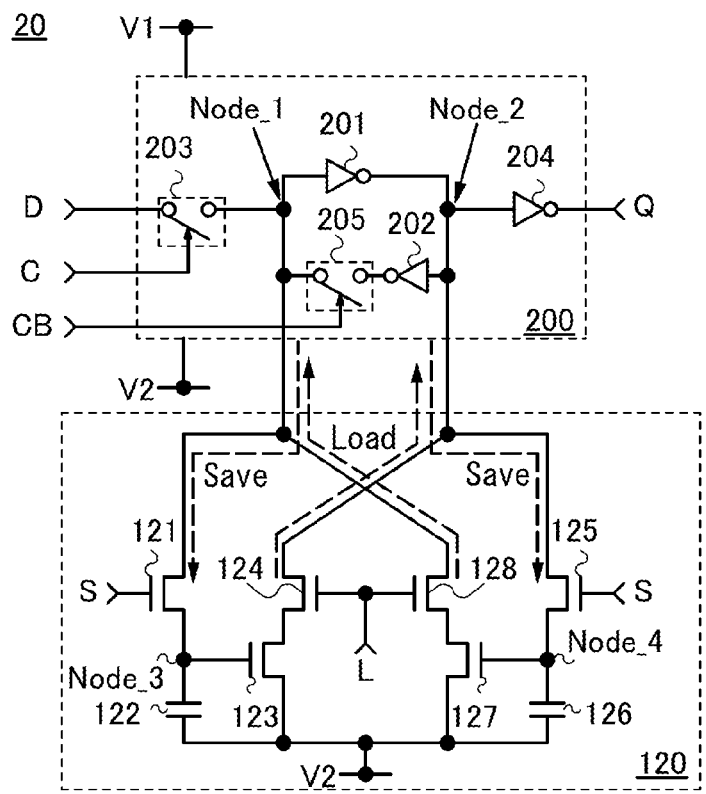
FIGS. 2A and 2B are a circuit diagram and a timing chart of a semiconductor device.

FIG. 2A is a circuit diagram of a semiconductor device 20 in which the memory circuit portion 110 in FIG. 1 is replaced with a memory circuit portion 200 for description of a specific example of operation.

The memory circuit portion 200 includes a node Node_1 and a node Node_2 capable of holding potentials corresponding to 1 and 0 as data in a period during which power supply voltage is continuously supplied. The memory circuit portion 200 is supplied with a potential V1 and a potential V2 (V1>V2). These potentials V1 and V2 are supplied as power supply voltage for the memory circuit portion 200.

The memory circuit portion 200 includes an inverter circuit 201, an inverter circuit 202, a switch 203, an inverter circuit 204, and a switch 205, for example.

The memory circuit portion 200 has a configuration in which a data signal D, a clock signal C, and an inverted clock signal CB are input and an output signal Q is output as an example.

An input terminal of the inverter circuit 201 is connected to the node Node_1. An output terminal of the inverter circuit 201 is connected to the node Node_2.

An input terminal of the inverter circuit 202 is connected to the node Node_2. An output terminal of the inverter circuit 202 is connected to one of terminals of the switch 205. The other of the terminals of the switch 205 is connected to the node Node_1. On/off of the switch 205 is controlled by the inverted clock signal CB.

One of terminals of the switch 203 is connected to a wiring to which the data signal D is input. The other of the terminals of the switch 203 is connected to the node Node_1. On/off of the switch 203 is controlled by the clock signal C.

An input terminal of the inverter circuit 204 is connected to the node Node_2. An output terminal of the inverter circuit 204 is connected to a wiring to which the output signal Q is input.

The switch 203 and the switch 205 each are an analog switch, for example. Alternatively, the switch 203 and the switch 205 each can be a transistor.

Although the inverter circuit 201 and the switch 205 are separately provided, one clocked inverter may be used instead of these circuits.

The inverter circuits 201, 202, and 204 are supplied with the potential V1 and the potential V2 as power supply voltage. Each of the inverter circuits 201, 202, and 204 outputs the potential V2 to the output terminal when the potential V1 is supplied to the input terminal and outputs the potential V1 to the output terminal when the potential V2 is supplied to the input terminal.

Note that the memory circuit portion 120 in FIG. 2A is similar to that in FIG. 1; thus, the description thereof is omitted.

Figure 2B:
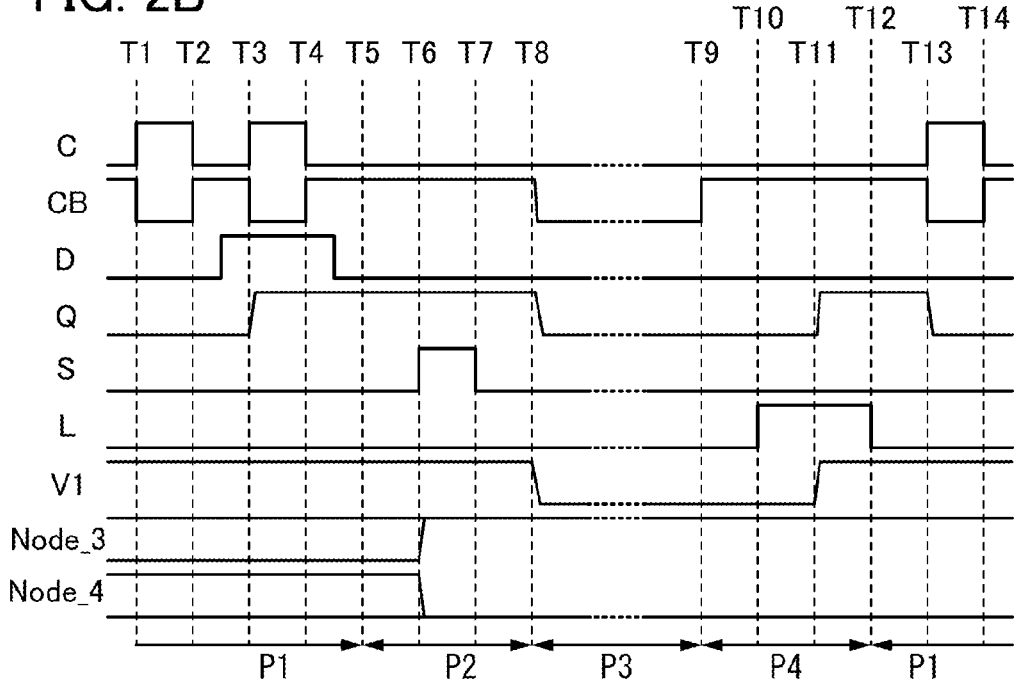

FIG. 2B is a timing chart of the semiconductor device 20 in FIG. 2A.

In the timing chart in FIG. 2B, a potential of a wiring to which the potential V1 is supplied is denoted by V1 for description. Switching the potential V1 from the H level to the L level means stopping the supply of power supply voltage to the semiconductor device 20. Switching the potential V1 from the L level to the H level means restarting the supply of power supply voltage to the semiconductor device 20.

In the timing chart in FIG. 2B, C indicates a potential of a wiring to which the clock signal is input; CB indicates a potential of a wiring to which an inverted clock signal is input; D indicates a potential of a wiring to which a data signal is input; Q indicates a potential of a wiring to which an output signal is input; S indicates a potential of a wiring to which a control signal Save is input; L indicates a potential of a wiring to which a control signal Load is input; V1 indicates the potential of the wiring to which the potential V1 is supplied as described above; Node_3 indicates a potential of a node Node_3; and Node_4 indicates a potential of a node Node_4.

In the timing chart in FIG. 2B, periods P1 to P4 show the state of the semiconductor device 20. The period P1 is a normal operation period. The period P2 is a transition period for operation stop. The period P3 is an operation stop period. The period P4 is a transition period for operation restart.

In the timing chart in FIG. 2B, times T1 to T14 are added in order to describe timing of operations in the periods P1 to P4.

In the period P1 which is the normal operation period, the clock signal is input to the wiring C and the inverted clock signal is input to the wiring CB. Signals at the L level are input to the wiring S and the wiring L. In that case, the memory circuit portion 200 can operate as a normal register or flip-flop. In other words, when the wiring C becomes the H level from the L level, the wiring Q has the same potential as the wiring D. Note that signal delay actually occurs; thus, after the wiring C becomes the H level from the L level, the potential of the wiring Q is changed.

In the period P2 which is the transition period for operation stop, the wiring C and the wiring CB are not changed. In other words, the wiring C and the wiring CB are fixed to a signal at the L level and a signal at the H level, respectively. Between the time T6 and the time T7, by inputting a signal at the H level to the wiring S, data held in the nodes Node_1 and Node_2 in the memory circuit portion 200 is saved. As an example, in FIG. 2B, a potential at the H level and a potential at the L level are held in the node Node_3 and the node Node_4, respectively.

In the period P2 which is the transition period for operation stop, the wiring V1 is set to the L level at the time T8. In other words, the supply of power supply voltage to the semiconductor device 20 is stopped. At this time, a signal at the L level is input to each of the wirings D and Q. A signal at the L level is also input to each of the wirings C and CB in the period T8.

In the period P3 which is the operation stop period, while the supply of power supply voltage is stopped, a signal at the L level is input to each of the wirings C, CB, D, and Q, and power consumption of the semiconductor device 20 is substantially zero. Note that the potentials of the nodes Node_3 and Node_4 are kept constant because almost no current flows.

In the period P4 which is the transition period for operation restart, the potentials of the wirings are sequentially brought back to the potentials at the end of the preceding normal operation period, that is, the time T5. First, at the time T9, the potentials of the wirings C and CB are set to the potentials at the time T5. Here, a signal at the L level is input to the wiring C and a signal at the H level is input to the wiring CB. Next, at the time T10, a signal at the H level is input to the wiring L. Then, at the time T11, a signal at the H level is input to the wiring V1, so that the supply of power supply voltage is restarted. At this time, the potentials of the nodes Node_3 and Node_4 are loaded into the memory circuit portion 200 by using difference of channel resistance between the transistors 123 and 127, so that data in the memory circuit portion 200 returns to the data at the time T5. That is, a signal at the H level is input to the wiring Q. Here, by setting the wiring V1 to the H level while the control signal L of the wiring L is kept at the H level, data can be easily loaded.

Then, the supply of clock signals and inverted clock signals to the wirings C and CB is restarted from the time T13. Further, after the time T12, operation can be started again in the same state as the time T5.

With the above-described structure, a semiconductor device which can easily achieve a stop and a restart of supply of power supply voltage can be provided.

In the above-described operation of the semiconductor device of this embodiment, the supply of power supply voltage can be stopped as appropriate by saving and loading data in the memory circuit portions 200 and 120. Thus, power consumption can be reduced.

Further, in the semiconductor device described in this embodiment, data saving in the memory circuit portions 200 and 120 can be controlled by turning on and turning off the transistors. Thus, operation delay is short compared with the case where data is saved to an external memory circuit portion. Further, a configuration can be used in which data saving is performed before the supply of power supply voltage is stopped and data is held in the memory circuit portion 200 in a period during which the power supply voltage is continuously supplied. Thus, in the period during which the power supply voltage is continuously supplied, data can be held at high speed, and operation delay can be suppressed.

3. Modification Example of Semiconductor Device in Circuit Diagram

Next, a modification example of the above-described semiconductor device is described.

Figure 3:
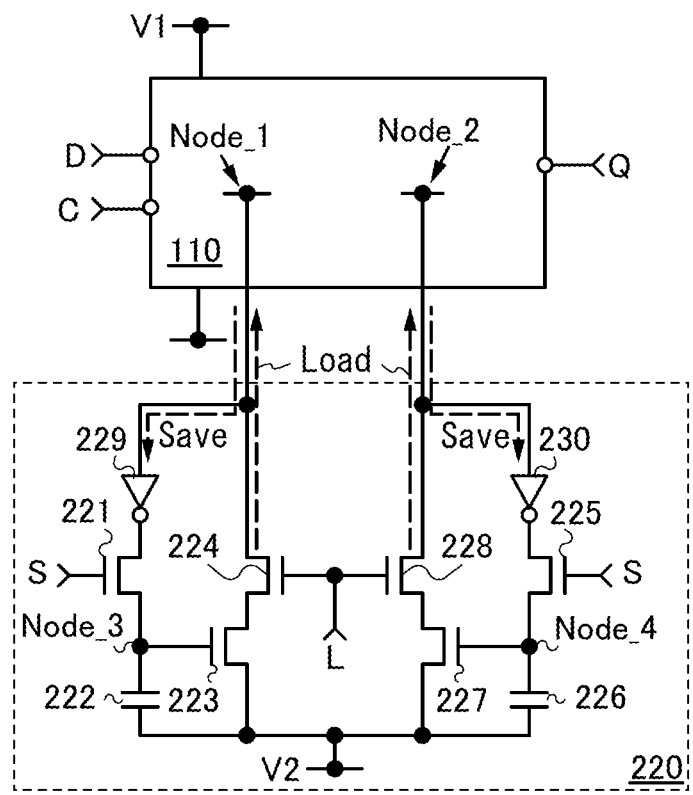
FIG. 3 is a circuit diagram of a semiconductor device.

The memory circuit portion 110 in a semiconductor device 30 in FIG. 3 is similar to that in FIG. 1; thus, description thereof is omitted.

FIG. 3 is a circuit diagram of the semiconductor device 30 in which the memory circuit portion 120 in the semiconductor device 10 in FIG. 1 is replaced with a memory circuit portion 220.

The memory circuit portion 220 in FIG. 3 can hold a potential corresponding to data in a period during which power supply voltage is continuously supplied.

The memory circuit portion 220 includes a transistor 221 (also referred to as a first transistor), a capacitor 222 (also referred to as a first capacitor), a transistor 223 (also referred to as a second transistor), a transistor 224 (also referred to as a third transistor), a transistor 225 (also referred to as a fourth transistor), a capacitor 226 (also referred to as a second capacitor), a transistor 227 (also referred to as a fifth transistor), a transistor 228 (also referred to as a sixth transistor), an inverter circuit 229 (also referred to as a first inverter circuit), and an inverter circuit 230 (also referred to as a second inverter circuit). Further, the memory circuit portion 220 includes a node Node_3 and a node Node_4 capable of holding potentials corresponding to 1 and 0 as data at least in the period during which the supply of power supply voltage is stopped.

The nodes Node_3 and Node_4 are similar to those in FIG. 1; thus, description thereof is omitted.

The memory circuit portion 220 in FIG. 3 is different from the memory circuit portion 120 in FIG. 1 in that the inverter circuit 229 is provided between the node Node_1 and the transistor 221, that the inverter circuit 230 is provided between the node Node_2 and the transistor 225, that the other of the source and the drain of the transistor 224 is connected to the node Node_1, and that the other of the source and the drain of the transistor 228 is connected to the node Node_2. That is, in FIG. 3, by adding the inverter circuits 229 and 230, connection relations between the memory circuit portion 220 and the nodes Node_1 and Node_2 are changed.

Description of components of the transistor 221, the capacitor 222, the transistor 223, the transistor 224, the transistor 225, the capacitor 226, the transistor 227, and the transistor 228 are similar to that of components of the transistor 121, the capacitor 122, the transistor 123, the transistor 124, the transistor 125, the capacitor 126, the transistor 127, and the transistor 128 in FIG. 1; thus, description thereof is omitted.

Further, the control signal Save and the control signal Load are similar to those in FIG. 1; thus, description thereof is omitted.

When the inverter circuits 229 and 230 are added to the semiconductor device 30 in FIG. 3, the number of transistors included in the semiconductor device is increased; however, a malfunction can be reduced.

Specifically, in the configuration in FIG. 1, a malfunction might occur as follows: when the transistors 121 and 125 are turned on by setting the control signal Save to the H level, charge moves from the nodes Node_3 and Node_4 to the nodes Node_1 and Node_2, so that data of the nodes Node_1 and Node_2 are rewritten. In particular, the above malfunction is likely to occur when capacitance of the capacitors 122 and 126 is increased to improve retention characteristics of data.

On the other hand, in the configuration in FIG. 3, there is no path through which charge directly moves from the nodes Node_3 and Node_4 to the nodes Node_1 and Node_2; thus, a malfunction in which data of the nodes Node_1 and Node_2 is rewritten does not occur. Therefore, even when the capacitance of the capacitors 222 and 226 is increased to improve retention characteristics of data, the above-described malfunction can be reduced.

Since an effect of reducing a malfunction is expected in the configuration in FIG. 3, the degree of freedom for design of a circuit included in the memory circuit portion 110 is increased; thus, the reliability of the semiconductor device can be increased.

4. Application Examples of Semiconductor Device

Next, application examples of the semiconductor device are described giving specific examples.

4-1. Examples of Application to Flip-Flop in PLD

4-1-1. Structure Example of PLD and LE

Figure 4:
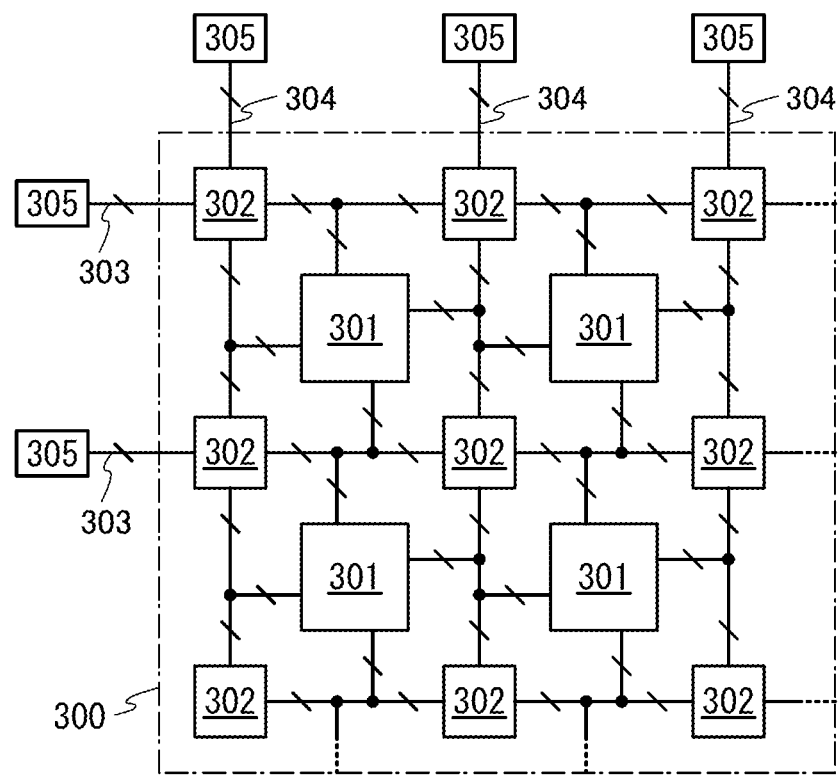
FIG. 4 is a block diagram illustrating a specific example of a semiconductor device.

FIG. 4 is an example of a block diagram of a logic array included in a PLD. A logic array 300 includes a plurality of LEs 301 arranged in an array. Here, the expression "arranged in an array" means that the logic elements are arranged in a matrix at regular intervals, and the arrangement is not limited to that illustrated in FIG. 4.

A plurality of wirings are formed to surround the LEs 301. In FIG. 4, these wirings consist of a plurality of horizontal wiring groups 303 and a plurality of vertical wiring groups 304. A wiring group is a bundle of a plurality of wirings. A switch portion 302 is provided at an intersection of the horizontal wiring group 303 and the vertical wiring group 304. The horizontal wiring groups 303 and the vertical wiring groups 304 are connected to input-output terminals 305 to transmit and receive signals to and from a circuit provided outside the logic array 300.

Input-output terminals of the plurality of LEs 301 are connected to the horizontal wiring groups 303 and the vertical wiring groups 304 provided around the LEs 301. For example, in FIG. 4, the input-output terminals of the LEs 301 are connected to the horizontal wiring groups 303 and the vertical wiring groups 304 up and down, left and right. With the use of these input-output terminals, each of the LEs 301 can be connected to another LE 301. A connection path between one LE 301 and another LE 301 is determined by a switch for switching connection between wirings provided in the switch portion 302.

On/off of the switch for switching connection between wirings in the switch portion 302 is determined in accordance with a configuration memory which stores configuration data. In the case of a rewritable structure, the configuration memory provided in the switch portion 302 preferably includes a nonvolatile memory element to prevent loss of stored configuration data due to a stop of supply of power supply voltage.

Figure 5:
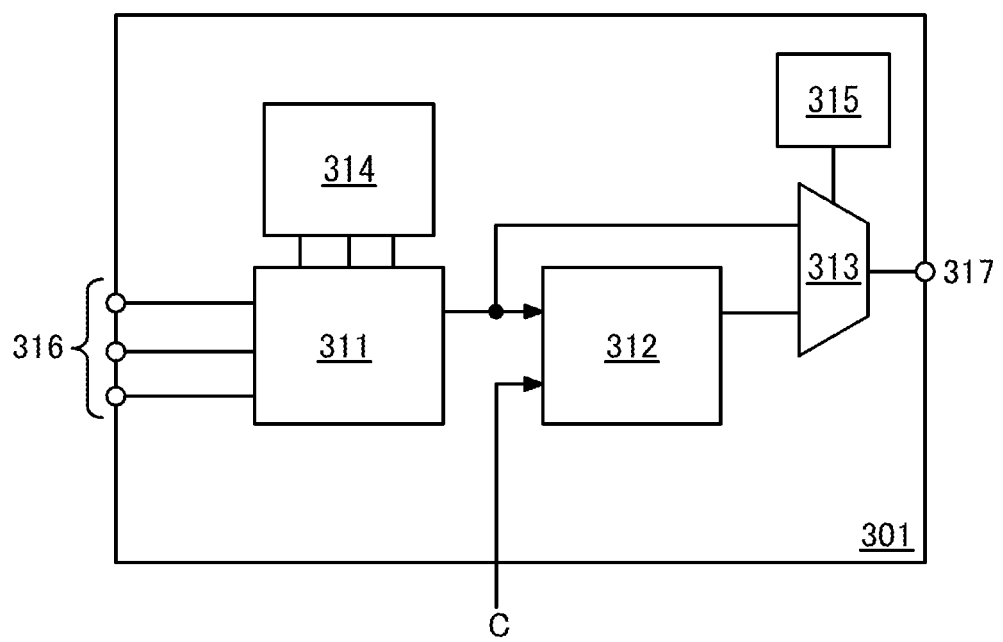
FIG. 5 is a block diagram illustrating a specific example of a semiconductor device.

FIG. 5 is a block diagram of the LE 301 in FIG. 4. The LE 301 in FIG. 5 includes a lookup table (hereinafter referred to as an LUT) 311, a flip-flop 312, and a multiplexer 313, for example. Further, in FIG. 5, configuration memories 314 and 315 connected to the LUT 311 and the multiplexer 313, respectively, are provided.

In the case of a rewritable structure, the configuration memories 314 and 315 each preferably include a nonvolatile memory element to prevent loss of stored configuration data due to a stop of the supply of power supply voltage.

The configuration data refers to data of the LUT 311, information on selection of input signals of the multiplexer 313, and data on the on state and off state of the switch portion 302, for example. The configuration memory refers to a memory element for storing the configuration data.

A logic circuit determined by the LUT 311 varies depending on the content of configuration data stored in the configuration memory 314. When the configuration data is determined, one output value of the LUT 311 with respect to input values of a plurality of input signals input to input terminals 316 is determined. Then, the LUT 311 outputs a signal including the output value.

The flip-flop 312 holds the signal output from the LUT 311 and outputs an output signal corresponding to the signal to the multiplexer 313 in synchronization with a clock signal C.

The output signal from the LUT 311 and the output signal from the flip-flop 312 are input to the multiplexer 313. The multiplexer 313 has a function of outputting either of the two output signals in accordance with configuration data stored in the configuration memory 315. The output signal from the multiplexer 313 is output from an output terminal 317.

In one embodiment of the present invention, the semiconductor device described in the above embodiment is applied to the circuit for temporarily storing data therein, e.g., the flip-flop 312; thus, loss of data in the flip-flop caused by a stop of the supply of power supply voltage can be prevented. Further, data held before the stop of the supply of power supply voltage can be saved in a short time, and the data can be loaded in a short time after the supply of power supply voltage is restarted. Accordingly, the supply of power supply voltage can be stopped in a plurality of logic elements included in the PLD. Thus, power consumption of the PLD can be low.

4-1-2. Structure Examples of Configuration Memory

Figure 9A:
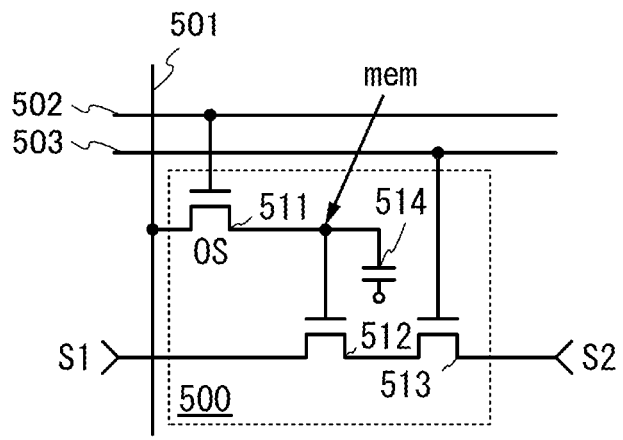
FIGS. 9A and 9B are circuit diagrams each illustrating a specific example of a semiconductor device.

FIG. 9A shows an example of a nonvolatile memory element which can be used as a configuration memory provided in the switch portion 302. The nonvolatile memory element in FIG. 9A has a structure in which a configuration memory is formed using a transistor including an oxide semiconductor. When the nonvolatile memory element used as the configuration memory is configured to hold data by utilizing a low off-state current of the transistor including an oxide semiconductor, the configuration memory can be manufactured through a manufacturing process of the transistor and by stacking the transistors, for example. This is highly advantageous in reducing cost.

FIG. 9A illustrates a configuration memory 500 provided in the switch portion 302, for example. The configuration memory 500 controls connection between a terminal S1 and a terminal S2 in accordance with configuration data held in a node mem.

The configuration memory 500 in FIG. 9A includes a transistor 511, a transistor 512, a transistor 513, and a capacitor 514.

Figure 9B:
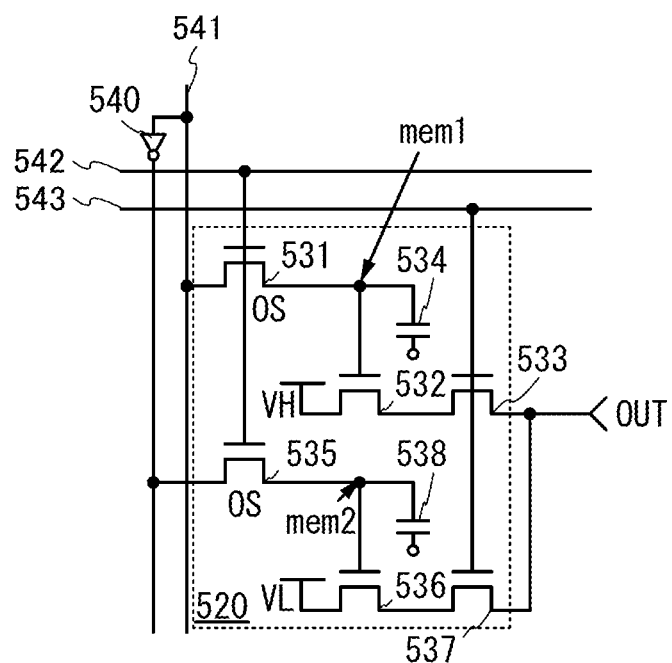

FIG. 9B illustrates a configuration memory 520 that can control the LUT 311 and the multiplexer 313, for example. The configuration memory 520 controls signals of an output terminal OUT in accordance with configuration data held in nodes mem1 and mem2. A potential VH and a potential VL are signals for controlling the LUT 311 or the multiplexer 313.

The configuration memory 520 in FIG. 9B includes a transistor 531, a transistor 532, a transistor 533, a capacitor 534, a transistor 535, a transistor 536, a transistor 537, and a capacitor 538.

For each of the transistor 511, the transistor 531, and the transistor 535, a semiconductor material that has a wider band gap and lower intrinsic carrier density than silicon is used. An oxide semiconductor is used for a channel formation region of the transistor. On the other hand, each of the transistor 512, the transistor 513, the transistor 532, the transistor 533, the transistor 536, and the transistor 537 preferably includes a semiconductor material such as silicon in a channel formation region so as to operate at higher speed than each of the transistor 511, the transistor 531, and the transistor 535.

Note that in the drawings, "OS" is written beside each of the transistor 511, the transistor 531, and the transistor 535 to indicate that each of the transistor 511, the transistor 531, and the transistor 535 includes an oxide semiconductor in the channel formation region.

The details of the configuration memory 500 are described with reference to FIG. 9A. As illustrated in FIG. 9A, a gate of the transistor 511 is connected to a first word line 502. One of a source and a drain of the transistor 511 is connected to a data line 501. The other of the source and the drain of the transistor 511 is connected to a gate of the transistor 512 and the capacitor 514. One of a source and a drain of the transistor 512 is connected to the terminal S1. The other of the source and the drain of the transistor 512 is connected to one of a source and a drain of the transistor 513. A gate of the transistor 513 is connected to a second word line 503. The other of the source and the drain of the transistor 513 is connected to the terminal S2.

In the configuration memory 500 in FIG. 9A, a potential corresponding to an H level or an L level is held in the node mem as configuration data. Configuration data can be stored in the node mem by using a transistor whose off-state current is extremely low as the transistor 511. In the configuration memory 500, the on state and off state of the transistor 512 are controlled in accordance with the potential of configuration data. At timing of turning on the transistor 513, the on state and off state between the terminal S1 and the terminal S2 can be controlled.

Next, the details of the configuration memory 520 are described with reference to FIG. 9B. As illustrated in FIG. 9B, a gate of the transistor 531 is connected to a first word line 542. One of a source and a drain of the transistor 531 is connected to a data line 541. The other of the source and the drain of the transistor 531 is connected to a gate of the transistor 532 and the capacitor 534. One of a source and a drain of the transistor 532 is connected to a wiring to which the potential VH is supplied. The other of the source and the drain of the transistor 532 is connected to one of a source and a drain of the transistor 533. A gate of the transistor 533 is connected to a second word line 543. The other of the source and the drain of the transistor 533 is connected to the output terminal OUT. A gate of the transistor 535 is connected to the first word line 542. One of a source and a drain of the transistor 535 is connected to the data line 541 through an inverter circuit 540. The other of the source and the drain of the transistor 535 is connected to a gate of the transistor 536 and the capacitor 538. One of a source and a drain of the transistor 536 is connected to a wiring to which the potential VL is supplied. The other of the source and the drain of the transistor 536 is connected to one of a source and a drain of the transistor 537. A gate of the transistor 537 is connected to the second word line 543. The other of the source and the drain of the transistor 537 is connected to the output terminal OUT.

In the configuration memory 520 in FIG. 9B, as configuration data, a potential corresponding to an H level and a potential corresponding to an L level are held in the nodes mem1 and mem2, respectively, or a potential corresponding to an L level and a potential corresponding to an H level are held in the nodes mem1 and mem2, respectively. Configuration data can be stored in the nodes mem1 and mem2 by using a transistor whose off-state current is extremely low as each of the transistors 531 and 535. In the configuration memory 520, the on state and off state of each of the transistors 532 and 536 are controlled in accordance with the potential of configuration data. At timing of turning on each of the transistors 533 and 537, a signal output from the output terminal OUT can be set to the potential VH or the potential VL.

4-2. Examples of Application to Register in CPU

Figure 6:
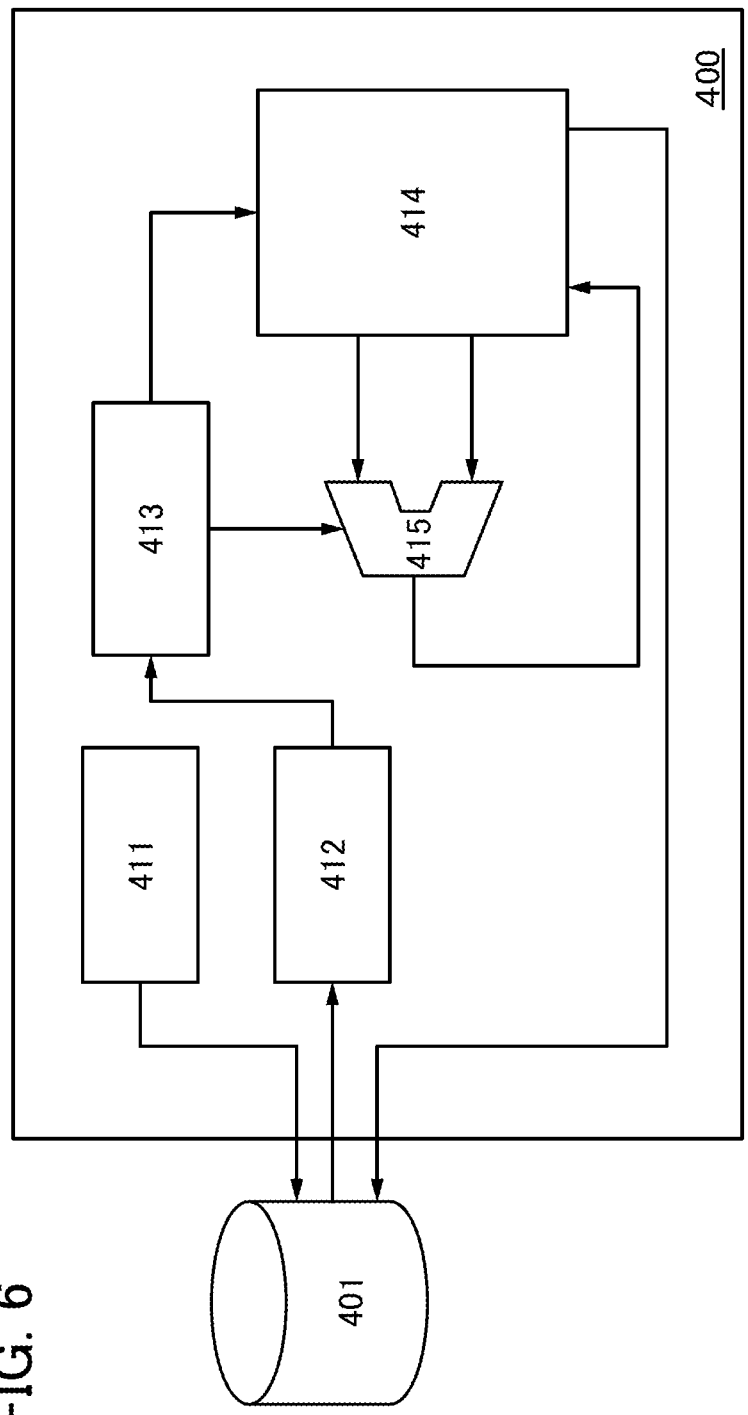
FIG. 6 is a block diagram illustrating a specific example of a semiconductor device.

FIG. 6 illustrates an example of a block diagram of a CPU.

A CPU 400 includes a program counter 411, an instruction register 412, an instruction decoder 413, a general-purpose register 414, and an arithmetic logic unit (ALU) 415, for example. A main memory device 401 for inputting and outputting data to and from the CPU 400 is provided outside the CPU 400.

The program counter 411 is a register which stores an address of an instruction (command) to be read (fetched). The instruction register 412 is a register for temporarily storing data transmitted to the instruction decoder 413 from the main memory device 401. The instruction decoder 413 is a circuit which decodes input data and generates signals for specifying a register in the general-purpose register 414, a signal for specifying an arithmetic method in the ALU 415, and the like. The general-purpose register 414 can store data read from the main memory device 401, data obtained during the arithmetic operations in the ALU 415, data obtained as a result of the arithmetic operations of the ALU 415, or the like. The ALU 415 has a function of performing a variety of arithmetic operations such as four arithmetic operations and logic operations. In the CPU 400, a data cache or the like, that is, a circuit which temporarily stores an arithmetic result or the like, may be additionally provided.

Next, operation of the CPU 400 is described.

The CPU 400 gives an instruction to output an address of a read out instruction which is specified by the program counter 411 to the main memory device 401. Next, data, which is stored in the main memory device 401, is read from an address of the instruction to be carried out and stored in the instruction register 412.

The instruction decoder 413 decodes the data stored in the instruction register 412 and generates signals for performing the instruction. Specifically, the instruction decoder 413 generates a signal for specifying a register in the general-purpose register 414, a signal for specifying an arithmetic method in the ALU 415, and the like.

The general-purpose register 414 outputs data specified by the instruction decoder 413 to the ALU 415 or the main memory device 401 in accordance with the instruction. In the ALU, arithmetic operations are carried out in accordance with an arithmetic method specified by the instruction decoder 413, and an arithmetic result is stored in the general-purpose register 414.

After the CPU 400 carries out the instruction, the CPU 400 reads an instruction, decodes data read from the instruction register 412, and carries out the instruction.

In one embodiment of the present invention, the semiconductor device described in the above embodiment is applied to registers for temporarily storing data in circuits, such as the program counter 411, the instruction register 412, the instruction decoder 413, and the general-purpose register 414; thus, loss of data in the registers caused by a stop of the supply of power supply voltage can be prevented. Further, data held before the stop of the supply of power supply voltage can be saved in a short time, and the data can be loaded in a short time after the supply of power supply voltage is restarted. Thus, in the entire CPU 400 or the circuits included in the CPU 400, the supply of power supply voltage can be stopped. Consequently, power consumption of the CPU 400 can be low.

Figure 7:
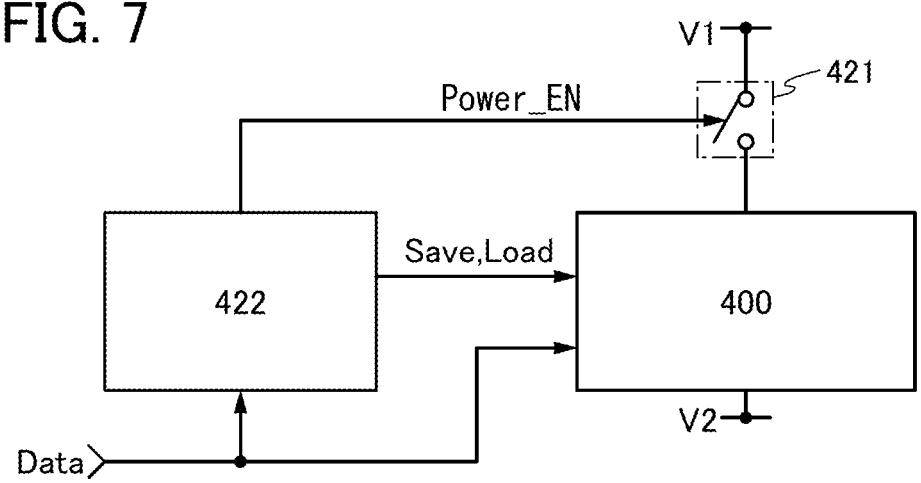
FIG. 7 is a block diagram illustrating a specific example of a semiconductor device.

FIG. 7 illustrates an example of a structure for stopping or restarting the supply of power supply voltage to the CPU 400. In FIG. 7, the CPU 400, a power switch 421, and a power supply control circuit 422 are provided.

The power switch 421 can control a stop or a restart of the supply of power supply voltage to the CPU 400 in accordance with its on state or off state. Specifically, the power supply control circuit 422 outputs a power control signal Power_EN for turning on or off the power switch 421 to control the stop or the restart of the supply of power supply voltage to the CPU 400. By turning on the power switch 421, power supply voltage is supplied to the CPU 400 from wirings to which the potentials V1 and V2 are supplied. Further, by turning off the power switch 421, a path of current between the wirings to which the potentials V1 and V2 are supplied is cut, so that the supply of power supply voltage to the CPU 400 is stopped.

The power supply control circuit 422 has a function of collectively controlling operations of the power switch 421 and the CPU 400 in accordance with the frequency of input data Data. Specifically, the power supply control circuit 422 outputs a power control signal Power_EN for turning on or off the power switch 421 and control signals Save and Load for controlling data saved and loaded in the register. As described above, the control signals Save and Load are signals for saving and loading potentials in the registers in the volatile memory circuit portion and the nonvolatile memory circuit portion.

Next, an example of operation of the CPU 400, the power switch 421, and the power supply control circuit 422 which are illustrated in FIG. 7 is described.

When the supply of power supply voltage is continuously performed, stopped, or restarted, determination is made in accordance with the frequency of data Data input to the power supply control circuit 422. Specifically, in the case where data Data is continuously input to the CPU 400, the power supply control circuit 422 outputs the power control signal so that the supply of power supply voltage is continued. In the case where data Data is input to the CPU 400 intermittently, at timing when the data Data is input, the power supply control circuit 422 outputs the power control signal so that the supply of power supply voltage is stopped or restarted.

It is preferable that the power supply control circuit 422 have a structure in which power supply voltage is continuously supplied even while the supply of power supply voltage to the CPU 400 is stopped. With the above structure, the supply of power supply voltage to the CPU 400 can be stopped or restarted at desired timing.

5. Structure Example of Semiconductor Device

Next, examples of a structure and a manufacturing method of a semiconductor device including a transistor 902 whose channel is formed in an oxide semiconductor layer and a transistor 901 whose channel is formed in a single crystal silicon wafer are described with reference to FIG. 10. Note that the transistor 902 can be used as the transistors 121 and 125 and the like shown in FIG. 1, and the transistor 901 can be used as transistors included in the memory circuit portions 110 and 120 and the like shown in FIG. 1.

Note that the transistor 901 may be formed using a semiconductor material such as germanium, silicon germanium, or single crystal silicon carbide as well as silicon. For example, the transistor including silicon can be formed using a silicon thin film which is formed by an SOI method, a silicon thin film which is formed by a vapor deposition method, or the like. In that case, a glass substrate formed by a fusion process or a float process, a quartz substrate, a semiconductor substrate, a ceramic substrate, or the like can be used as a substrate. In the case where the temperature of heat treatment to be performed later is high, use of a glass substrate whose strain point is higher than or equal to 730° C. is favorable.

Figure 10:
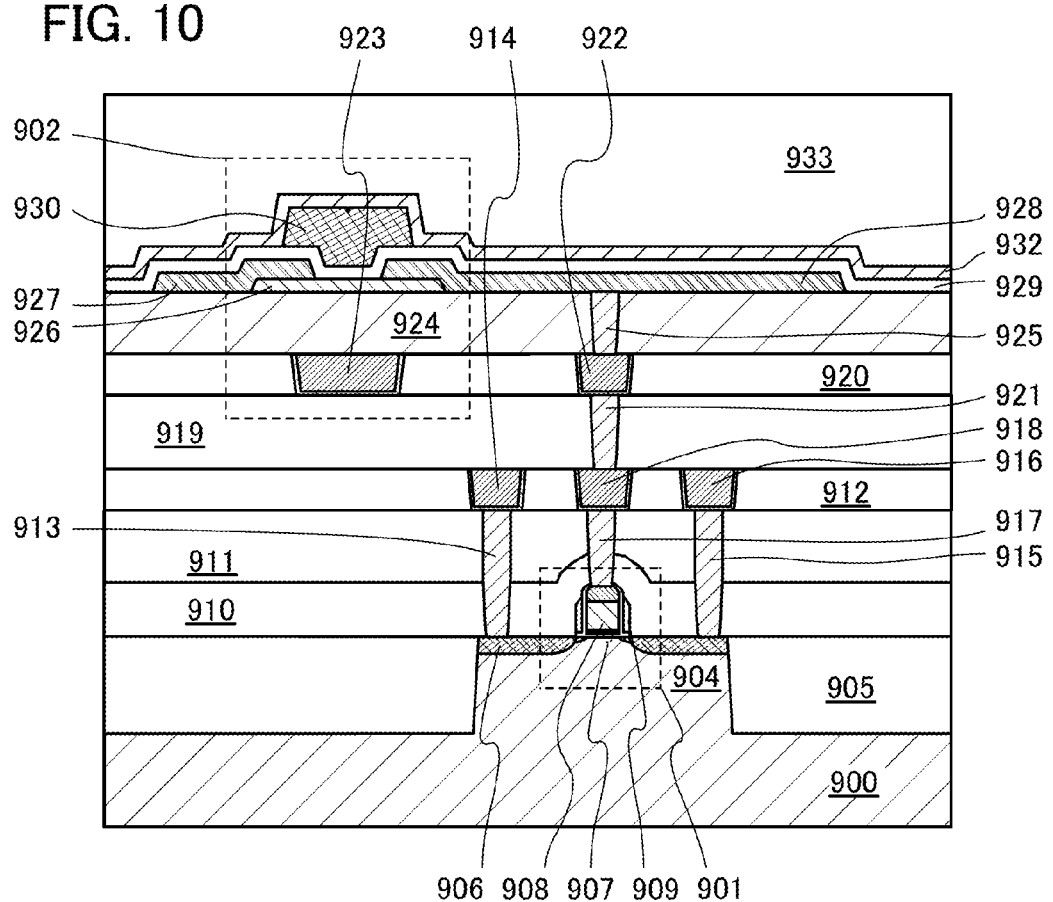
FIG. 10 is a diagram illustrating an example of a structure of a semiconductor device.

In the semiconductor device illustrated in FIG. 10, the transistor 901 including a single crystal silicon wafer is formed, and the transistor 902 including an oxide semiconductor is formed in a level higher than the level of the transistor 901. In other words, the semiconductor device described in this embodiment is a semiconductor device that has a three-dimensional stacked-layer structure in which a silicon wafer is used as a substrate and a transistor layer is provided above the silicon wafer. Moreover, the semiconductor device described in this embodiment is a hybrid semiconductor device including a transistor in which silicon is used for a channel formation region and a transistor in which an oxide semiconductor is used for a channel formation region.

Either an n-channel transistor (NMOSFET) or a p-channel transistor (PMOSFET) can be used as the transistor 901 formed using a substrate 900 containing a semiconductor material. In the example shown in FIG. 10, the transistor 901 is electrically isolated from other elements by a shallow trench isolation (STI) 905. The use of the STI 905 can reduce generation of a bird's beak, which is caused by a LOCOS element isolation method, in an element isolation region, and can reduce the size of the element isolation region. On the other hand, in a semiconductor device that is not required to be structurally miniaturized or downsized, the STI 905 is not necessarily formed and an element isolation method such as LOCOS can be used. In the substrate 900 where the transistor 901 is formed, a well 904 to which an impurity imparting conductivity, such as boron, phosphorus, or arsenic, is added is formed.

The transistor 901 in FIG. 10 includes a channel formation region in the substrate 900, impurity regions 906 (also referred to as a source region and a drain region) provided such that the channel formation region is provided therebetween, a gate insulating film 907 over the channel formation region, and a gate electrode layer 908 over the gate insulating film 907 to overlap with the channel formation region. The gate electrode layer 908 can have a stacked-layer structure of a gate electrode layer including a first material for increasing processing accuracy and a gate electrode layer including a second material for reducing the resistance to be used as a wiring. For example, the gate electrode layer 908 can have a stacked-layer structure of nickel silicide and crystalline silicon to which an impurity imparting conductivity, such as phosphorus, is added. Note that the structure is not limited thereto, and materials, the number of stacked layers, the shape, or the like can be adjusted as appropriate depending on required specifications.

Note that the transistor 901 illustrated in FIG. 10 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film provided between the gate electrode layer and the protrusion. With the transistor 901 having a fin-type structure, the channel width can be reduced to achieve higher integration of the transistor 901. Further, a larger amount of current can flow through the transistor 901 and the control efficiency can be increased, so that the off-state current and threshold voltage of the transistor 901 can be reduced.

Contact plugs 913 and 915 are connected to the impurity regions 906 in the substrate 900. Here, the contact plugs 913 and 915 also function as a source electrode and a drain electrode of the transistor 901 to which the contact plugs 913 and 915 are connected. In addition, impurity regions that are different from the impurity regions 906 are provided between the impurity regions 906 and the channel formation region. These impurity regions function as LDD regions or extension regions for controlling the distribution of an electric field in the vicinity of the channel formation region, depending on the concentration of an impurity introduced thereto. Sidewall insulating films 909 are provided at side surfaces of the gate electrode layer 908 with an insulating film provided therebetween. By using this insulating film and the sidewall insulating films 909, the LDD regions or extension regions can be formed.

The transistor 901 is covered with an insulating film 910. The insulating film 910 can function as a protective film and can prevent impurities from entering the channel formation region from the outside. With the insulating film 910 formed by a CVD method with a material such as silicon nitride, hydrogenation can be performed by heat treatment in the case of using single crystal silicon for the channel formation region. When an insulating film having tensile stress or compressive stress is used as the insulating film 910, distortion can be provided to the semiconductor material used for the channel formation region. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and the surface of the insulating film 911 is planarized by CMP. Accordingly, element layers in levels higher than the level including the transistor 901 can be stacked with high accuracy.

A level including the transistor 902 whose channel is formed in the oxide semiconductor layer is formed above the level including the transistor 901. The transistor 902 is a top-gate transistor and includes a source electrode layer 927 and a drain electrode layer 928 in contact with side surfaces and an upper surface of an oxide semiconductor film 926, and a gate electrode layer 930 over a gate insulating film 929 over the oxide semiconductor film 926, the source electrode layer 927, and the drain electrode layer 928. An insulating film 932 and an insulating film 933 are formed to cover the transistor 902. Here, a manufacturing method of the transistor 902 is described below.

The oxide semiconductor film 926 is formed over an insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. In particular, the insulating film 924 is preferably formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than an insulating film with high density, parasitic capacitance due to electrodes or wirings can be further reduced. In this embodiment, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is larger than or equal to 2 nm and smaller than or equal to 200 nm, preferably larger than or equal to 3 nm and smaller than or equal to 50 nm, more preferably larger than or equal to 3 nm and smaller than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is deposited by a sputtering method, dust on the surface of the insulating film 924 is preferably removed by reverse sputtering in which an argon gas is introduced and plasma is generated. The reverse sputtering refers to a method in which, without application of voltage to the target side, an RF power source is used for application of voltage to a substrate side in an argon atmosphere to generate plasma in the vicinity of the substrate to modify the surface. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this embodiment, as the oxide semiconductor film, a 30-nm-thick In—Ga—Zn-based oxide semiconductor thin film, which is obtained by a sputtering method using a target including indium (In), gallium (Ga), and zinc (Zn), is used. As the above target, it is preferable to use a target containing In, Ga, and Zn at an atomic ratio of 1:1:1, 4:2:3, 3:1:2, 1:1:2, 2:1:3, or 3:1:4. The filling factor of the target including In, Ga, and Zn is higher than or equal to 90% and lower than or equal to 100%, preferably higher than or equal to 95% and lower than 100%. With the use of the target with a high filling rate, a dense oxide semiconductor film is deposited.

In the case of using an In—Zn-based material for the oxide semiconductor film, a target containing In and Zn at an atomic ratio of 50:1 to 1:2 ($In_2O_3$:ZnO=25:1 to 1:4 in a molar ratio), preferably In and Zn at an atomic ratio of 20:1 to 1:1 ($In_2O_3$:ZnO=10:1 to 1:2 in a molar ratio), more preferably In and Zn at an atomic ratio of 1.5:1 to 15:1 at an atomic ratio ($In_2O_3$:ZnO=3:4 to 15:2 in a molar ratio) is to be used. For example, in a target used for formation of an In—Zn-based oxide semiconductor containing In, Zn, and O at an atomic ratio of X:Y:Z, the relation of Z>1.5X+Y is satisfied. The mobility can be improved by keeping the ratio of Zn within the above range.

In the case of forming an In—Sn—Zn-based oxide semiconductor film as the oxide semiconductor film by a sputtering method, it is preferable to use an In—Sn—Zn—O target containing In, Sn, and Zn at an atomic ratio of 1:1:1, 2:1:3, 1:2:2, or 20:45:35.

In this embodiment, the oxide semiconductor film is formed in such a manner that the substrate is held in a treatment chamber kept at reduced pressure, a sputtering gas from which hydrogen and moisture have been removed is introduced to the treatment chamber while moisture remaining therein is removed, and the above-described target is used. The substrate temperature may be higher than or equal to 100° C. and lower than or equal to 600° C., preferably higher than or equal to 200° C. and lower than or equal to 400° C. during film formation. By forming the oxide semiconductor film in a state where the substrate is heated, the impurity concentration in the formed oxide semiconductor film can be reduced. In addition, damage due to sputtering can be reduced. In order to remove moisture remaining in the treatment chamber, an entrapment vacuum pump is preferably used. For example, a cryopump, an ion pump, or a titanium sublimation pump is preferably used. The evacuation unit may be a turbo pump provided with a cold trap. In the treatment chamber which is evacuated with the cryopump, for example, a hydrogen atom, a compound containing a hydrogen atom, such as water ($H_2O$), and the like are evacuated, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferable because dust generated in deposition can be reduced and the film thickness can be made uniform.

Moreover, when the leakage rate of the treatment chamber of the sputtering apparatus is set to be lower than or equal to $1 \times 10^{-10}$ Pa·$m^3$/second, entry of impurities such as an alkali metal or hydride into the oxide semiconductor film that is being formed by a sputtering method can be reduced. Further, with the use of the entrapment vacuum pump as an evacuation system, counter flow of impurities such as an alkali metal, a hydrogen atom, a hydrogen molecule, water, or hydride from the evacuation system can be reduced.

When the purity of the target is set to be higher than or equal to 99.99%, an alkali metal, a hydrogen atom, a hydrogen molecule, water, a hydroxyl group, hydride, or the like entering the oxide semiconductor film can be reduced. In addition, when the target is used, the concentration of an alkali metal such as lithium, sodium, or potassium can be reduced in the oxide semiconductor film.

In order that the oxide semiconductor film does not contain hydrogen, a hydroxyl group, and moisture as much as possible, it is preferable that impurities such as moisture or hydrogen that are adsorbed on the substrate 900 be eliminated and evacuated by preheating the substrate 900 over which the films and the like including the insulating film 924 are formed in a preheating chamber of the sputtering apparatus, as pretreatment for deposition. The temperature for the preheating is higher than or equal to 100° C. and lower than or equal to 400° C., preferably higher than or equal to 150° C. and lower than or equal to 300° C. As an evacuation unit provided in the preheating chamber, a cryopump is preferable. Note that this preheating treatment can be omitted.

Note that etching for forming the oxide semiconductor film 926 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP)

etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

A resist mask used for forming the oxide semiconductor film 926 may be formed by an inkjet method. Formation of the resist mask by an inkjet method needs no photomask; thus, manufacturing cost can be reduced.

Note that it is preferable that reverse sputtering be performed before the formation of a conductive film in a subsequent step so that a resist residue and the like that are attached onto the surfaces of the oxide semiconductor film 926 and the insulating film 924 are removed.

Note that the oxide semiconductor film deposited by sputtering or the like sometimes contains a large amount of moisture or hydrogen (including a hydroxyl group) as impurities. Moisture or hydrogen easily forms donor levels and thus serves as an impurity in the oxide semiconductor. In this embodiment, in order to reduce impurities such as moisture or hydrogen in the oxide semiconductor film 926 (in order to perform dehydration or dehydrogenation), the oxide semiconductor film 926 is subjected to heat treatment in a reduced-pressure atmosphere, an inert gas atmosphere of nitrogen, a rare gas, or the like, an oxygen gas atmosphere, or ultra-dry air (the moisture amount is less than or equal to 20 ppm (−55° C. by conversion into a dew point), preferably less than or equal to 1 ppm, more preferably less than or equal to 10 ppb in the case where measurement is performed by a dew point meter in a cavity ring-down laser spectroscopy (CRDS) method).

By performing the heat treatment on the oxide semiconductor film 926, moisture or hydrogen in the oxide semiconductor film 926 can be released. Specifically, the heat treatment may be performed at a temperature higher than or equal to 250° C. and lower than or equal to 750° C., preferably higher than or equal to 400° C. and lower than the strain point of the substrate. For example, heat treatment may be performed at 500° C. for approximately three minutes to six minutes. When a rapid thermal anneal (RTA) method is used for the heat treatment, dehydration or dehydrogenation can be performed in a short time; thus, the treatment can be performed even at a temperature higher than the strain point of a glass substrate.

In this embodiment, an electrical furnace that is one of heat treatment apparatuses is used.

Note that the heat treatment apparatus is not limited to an electric furnace, and may have a device for heating an object to be processed by heat conduction or heat radiation from a heating element such as a resistance heating element. For example, an RTA apparatus such as a gas rapid thermal anneal (GRTA) apparatus or a lamp rapid thermal anneal (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with an object to be processed by heat treatment, like nitrogen or a rare gas such as argon, is used.

In the heat treatment, it is preferable that moisture, hydrogen, and the like be not contained in nitrogen or a rare gas such as helium, neon, or argon. Alternatively, the purity of nitrogen or a rare gas such as helium, neon, or argon which is introduced to the heat treatment apparatus is preferably greater than or equal to 6N (99.9999%), more preferably greater than or equal to 7N (99.99999%) (i.e., the impurity concentration is less than or equal to 1 ppm, preferably less than or equal to 0.1 ppm).

Through the above process, the concentration of hydrogen in the oxide semiconductor film 926 can be reduced and the oxide semiconductor film 926 can be highly purified. Accordingly, the oxide semiconductor film can be stabilized. In addition, by using the oxide semiconductor film in which the hydrogen concentration is reduced and the purity is improved, it is possible to fabricate a transistor with high withstand voltage and an extremely low off-state current. The above heat treatment can be performed at any time after the oxide semiconductor film is formed.

Next, the source electrode layer 927 and the drain electrode layer 928 are formed through a photolithography process. Specifically, the source electrode layer 927 and the drain electrode layer 928 can be formed in such a manner that a conductive film is formed over the insulating film 924 by a sputtering method or a vacuum evaporation method and then processed (patterned) into a predetermined shape.

In this embodiment, a 100-nm-thick tungsten film is used for the source electrode layer 927 and the drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partly etched and thus a groove (a recessed portion) is formed in some cases.

Since the tungsten film is used as the conductive film to be the source electrode layer 927 and the drain electrode layer 928 in this embodiment, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing carbon tetrafluoride (CE), chlorine ($Cl_2$), or oxygen.

In order to reduce the numbers of photomasks and steps in the photolithography process, etching may be performed with the use of a resist mask formed using a multi-tone mask through which light is transmitted so as to have a plurality of intensities. The resist mask formed using a multi-tone mask has a plurality of thicknesses and can be changed in shape by ashing; thus, the resist mask can be used in a plurality of etching steps for processing films into different patterns. In other words, a resist mask corresponding to at least two kinds of different patterns can be formed by one multi-tone mask. Thus, the number of light-exposure masks can be reduced and the number of corresponding photolithography processes can be also reduced, whereby the process can be simplified.

Further, an oxide conductive film functioning as a source region and a drain region may be provided between the oxide semiconductor film 926 and the source and drain electrode layers 927 and 928. The material of the oxide conductive film preferably contains zinc oxide as a component and preferably does not contain indium oxide. For such an oxide conductive film, zinc oxide, zinc aluminum oxide, zinc aluminum oxynitride, gallium zinc oxide, or the like can be used.

For example, in the case where the oxide conductive film is formed, patterning for forming the oxide conductive film and patterning for forming the source electrode layer 927 and the drain electrode layer 928 may be performed concurrently.

By providing the oxide conductive film functioning as the source region and the drain region, the resistance between the oxide semiconductor film 926 and the source and drain electrode layers 927 and 928 can be reduced, so that the transistor can operate at high speed. In addition, with the oxide conductive film functioning as the source region and the drain region, the withstand voltage of the transistor can be increased.

Next, plasma treatment using a gas such as $N_2O$, $N_2$, or Ar may be performed. By this plasma treatment, water or the like adhering to an exposed surface of the oxide semiconductor film is removed. Alternatively, plasma treatment using a mixture gas of oxygen and argon may be performed.

After the plasma treatment, the gate insulating film 929 is formed to cover the source and drain electrode layers 927 and 928 and the oxide semiconductor film 926. Then, the gate electrode layer 930 is formed over the gate insulating film 929 so as to overlap with the oxide semiconductor film 926.

In this embodiment, a 20-nm-thick silicon oxynitride film formed by a sputtering method is used as the gate insulating film 929. The substrate temperature during film formation is in the range of room temperature to 400° C., and is 300° C. in this embodiment.

After the gate insulating film 929 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably lower than or equal to 20 ppm, more preferably lower than or equal to 1 ppm, further preferably lower than or equal to 10 ppb. In this embodiment, for example, the heat treatment is performed at 250° C. in a nitrogen atmosphere for an hour. Alternatively, RTA treatment for a short time at a high temperature may be performed before the formation of the source electrode layer 927 and the drain electrode layer 928 in a manner similar to that of the heat treatment performed on the oxide semiconductor film 926 for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing the heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made substantially i-type and fluctuation in electric characteristics of the transistors due to oxygen vacancies can be reduced, which results in improvement of electric characteristics. There is no particular limitation on the timing of this heat treatment as long as it is after the formation of the gate insulating film 929. When this heat treatment also serves as heat treatment in another step, the oxide semiconductor film 926 can be made substantially i-type without an increase in the number of steps.

Alternatively, oxygen vacancies that serve as donors in the oxide semiconductor film 926 may be reduced by subjecting the oxide semiconductor film 926 to heat treatment in an oxygen atmosphere so that oxygen is added to the oxide semiconductor film 926. The heat treatment is performed at a temperature higher than or equal to 100° C. and lower than 350° C., preferably higher than or equal to 150° C. and lower than 250° C., for example. It is preferable that an oxygen gas used for the heat treatment under an oxygen atmosphere do not include water, hydrogen, or the like. Alternatively, the purity of the oxygen gas which is introduced to the heat treatment apparatus is preferably greater than or equal to 6N (99.9999%), more preferably greater than or equal to 7N (99.99999%) (i.e., the impurity concentration in the oxygen gas is less than or equal to 1 ppm, preferably less than or equal to 0.1 ppm).

Further alternatively, oxygen may be added to the oxide semiconductor film 926 by an ion implantation method, an ion doping method, or the like to reduce oxygen vacancies that serve as donors. For example, it is favorable to add oxygen that is made into a plasma state with a microwave at 2.45 GHz to the oxide semiconductor film 926.

The gate electrode layer 930 can be formed in such a manner that a conductive film is formed over the gate insulating film 929 and is then patterned.

The thickness of the gate electrode layer 930 is 10 nm to 400 nm, preferably 100 nm to 300 nm. In this embodiment, the gate electrode layer 930 is formed in the following manner: a 135-nm-thick tungsten film is stacked over a 30-nm-thick tantalum nitride film by a sputtering method to form a conductive film for the gate electrode, and then, the conductive film is processed (patterned) into a desired shape by etching. Note that a resist mask may be formed by an inkjet method. Formation of the resist mask by an inkjet method needs no photomask; thus, manufacturing cost can be reduced.

Through the above process, the transistor 902 is formed.

Although the transistor 902 is described as a single-gate transistor, a multi-gate transistor which includes a plurality of gate electrodes electrically connected to each other so that a plurality of channel formation regions are formed can be formed as needed.

In the manufacturing method described above, the source electrode layer 927 and the drain electrode layer 928 are formed after the oxide semiconductor film 926. Accordingly, as illustrated in FIG. 10, in the transistor 902 obtained by the above manufacturing method, the source electrode layer 927 and the drain electrode layer 928 are formed over the oxide semiconductor film 926. Alternatively, in the transistor 902, the source electrode layer 927 and the drain electrode layer 928 may be formed below the oxide semiconductor film 926, that is, between the oxide semiconductor film 926 and the insulating film 924.

Note that the insulating films in contact with the oxide semiconductor film 926 may be each formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating films in contact with the oxide semiconductor film, the state of the interface with the oxide semiconductor film can be kept well.

The insulating material containing an element that belongs to Group 13 is an insulating material containing one or more elements that belong to Group 13. As the insulating material containing an element that belongs to Group 13, gallium oxide, aluminum oxide, aluminum gallium oxide, and gallium aluminum oxide are given, for example. Here, aluminum gallium oxide refers to a material in which the amount of aluminum is larger than that of gallium in atomic percent, and gallium aluminum oxide refers to a material in which the amount of gallium is larger than or equal to that of aluminum in atomic percent.

For example, by using a material containing gallium oxide for the insulating films in contact with an oxide semiconductor film containing gallium, characteristics of the interfaces between the oxide semiconductor film and the insulating films can be kept favorable. When the oxide semiconductor film and the insulating film containing gallium oxide are provided in contact with each other, pileup of hydrogen at the interface between the oxide semiconductor film and the insulating film can be reduced, for example. Note that a similar effect can be obtained in the case where an element in the same group as a constituent element of the oxide semiconductor is used for the insulating films. For example, it is effective to form the insulating films with the use of a material including aluminum oxide. Note that water is less likely to permeate aluminum oxide, and it is therefore preferable to use a material containing aluminum oxide in terms of preventing entry of water to the oxide semiconductor film.

The insulating films in contact with the oxide semiconductor film 926 preferably contain oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

By the oxygen doping treatment, an insulating film that includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen vacancies in the oxide semiconductor film or at the interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferable to use such an insulating film as both of the insulating films in contact with the oxide semiconductor film 926. The above-described effect can be enhanced with a structure where the insulating films each including a region where the proportion of oxygen is higher than that in the stoichiometric composition are used as insulating films in contact with the oxide semiconductor film 926 and placed above and below the oxide semiconductor film 926 so that the oxide semiconductor film 926 is provided between the insulating films.

The insulating films placed above and below the oxide semiconductor film 926 may contain the same constituent elements or different constituent elements. The insulating films in contact with the oxide semiconductor film 926 may be each a stack of insulating films each including a region where the proportion of oxygen is higher than that in the stoichiometric composition.

Note that in this embodiment, the transistor 902 has a top-gate structure. The transistor 902 includes a back-gate electrode layer 923. With the back-gate electrode layer 923, normally-off characteristics of the transistor 902 can be further achieved. For example, when the potential of the back-gate electrode layer 923 is set at GND or a fixed potential, the threshold voltage of the transistor 902 can be further shifted in the positive direction and thus, the transistor 902 can be a normally-off transistor.

In order to electrically connect the transistor 901 and the transistor 902 to form an electric circuit, one or more wiring layers for connecting these elements are stacked between layers and on the upper layer.

In FIG. 10, one of the source and the drain of the transistor 901 is electrically connected to a wiring layer 914 through the contact plug 913. The other of the source and the drain of the transistor 901 is electrically connected to a wiring layer 916 through the contact plug 915. Moreover, the gate of the transistor 901 is electrically connected to the drain electrode layer 928 of the transistor 902 through a contact plug 917, a wiring layer 918, a contact plug 921, a wiring layer 922, and a contact plug 925.

The wiring layers 914, 918, 916, and 922 and the back-gate electrode layer 923 are embedded in the insulating films. These wiring layers and the like are preferably formed using a low-resistance conductive material such as copper or aluminum. Alternatively, these wiring layers can be formed using graphene formed by a CVD method as a conductive material. Graphene is a one-atom thick sheet of $sp^2$-bonded carbon molecules or a stack of 2 to 100 sheets of carbon molecules. Examples of a method for manufacturing such graphene are a thermal CVD method by which graphene is formed on a metal catalyst and a plasma CVD method by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is separate from the wiring layer, or may be formed in such a manner that a material of the barrier film is included in a wiring material and precipitated by heat treatment on the inner wall of an opening provided in the insulating film.

The insulating film 911, an insulating film 912, an insulating film 919, an insulating film 920, and the insulating film 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from $Si(OC_2H_5)_4$ (tetraethylorthosilicate: TEOS), hydrogen silsesquioxane (HSQ), methyl silsesquioxane (MSQ), organosilicate glass (OSG), or an organic polymer-based material. In particular, in the case of advancing miniaturization of a semiconductor device, parasitic capacitance between wiring layers is significant and signal delay is increased; therefore, the relative permittivity of silicon oxide (k=4.0 to 4.5) is too high, and it is preferable to use a material with k of less than or equal to 3.0. In addition, CMP treatment is performed after the wiring layers are embedded in the insulating films; therefore, the insulating films needs to have high mechanical strength. As long as their mechanical strength can be secured, the insulating films can be made porous to have a lower dielectric constant. The insulating films are formed by a sputtering method, a CVD method, a coating method including a spin coating method (also referred to as spin on glass (SOG)), or the like.

An insulating film functioning as an etching stopper in the case of performing planarization treatment by CMP or the like may be additionally provided after the wiring material is embedded in the insulating films 911, 912, 919, 920, and 933.

Each of the contact plugs 913, 915, 917, 921, and 925 is formed in such a manner that an opening (a via hole) with a high aspect ratio is formed in the insulating film and is filled with a conductive material such as tungsten. The opening is preferably formed by highly anisotropic dry etching. In particular, a reactive ion etching (RIE) method is preferably used. A barrier film (diffusion prevention film) which is a titanium film, a titanium nitride film, a stacked layer of them, or the like is formed on an inner wall of the opening and a material such as tungsten or polysilicon doped with phosphorus is embedded in the barrier film. For example, tungsten can be embedded in the via hole by a blanket CVD method, and an upper surface of the contact plug is planarized by CMP.

6. Action and Effect of Semiconductor Device Disclosed in this Specification With the use of the semiconductor device and the driving method thereof which are disclosed in this specification, supply of power supply voltage can be stopped as appropriate.

Thus, power supply voltage can be intermittently supplied, which enables a reduction in power consumption.

With the use of the semiconductor device and the driving method thereof which are disclosed in this specification, data can be saved before the supply of power supply voltage is stopped and the data can be loaded after the supply of power supply voltage is restarted.

Thus, operation delay in the case where power supply voltage is continuously supplied can be suppressed.

This embodiment can be implemented in appropriate combination with any of the structures described in the other embodiment.

Embodiment 2

A semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Further, as electronic devices that can include the semiconductor device of one embodiment of the present invention, cellular phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATMs), vending machines, and the like can be given. FIGS. 8A to 8F illustrate specific examples of these electronic devices.

Figure 8A:
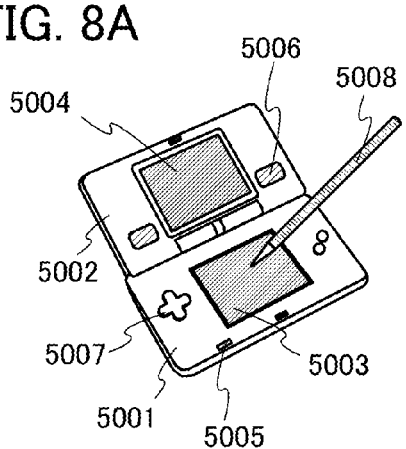
FIGS. 8A to 8F each illustrate an example of an electronic device.

FIG. 8A illustrates a portable game console, which includes a housing 5001, a housing 5002, a display portion 5003, a display portion 5004, a microphone 5005, a speaker 5006, an operation key 5007, a stylus 5008, and the like. Note that although the portable game console in FIG. 8A includes the two display portions 5003 and 5004, the number of display portions included in the portable game console is not limited thereto.

Figure 8B:
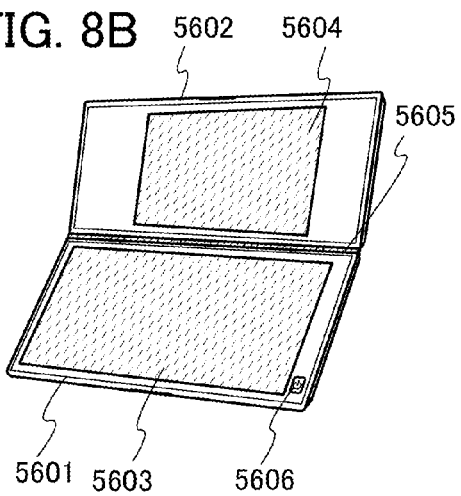

FIG. 8B illustrates a portable information terminal, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. An image on the first display portion 5603 may be switched depending on the angle between the first housing 5601 and the second housing 5602 at the joint 5605. A display device with a position input function may be used as at least one of the first display portion 5603 and the second display portion 5604. Note that the position input function can be added by provision of a touch panel in a display device. Alternatively, the position input function can be added by provision of a photoelectric conversion element called a photosensor in a pixel portion of a display device.

Figure 8C:
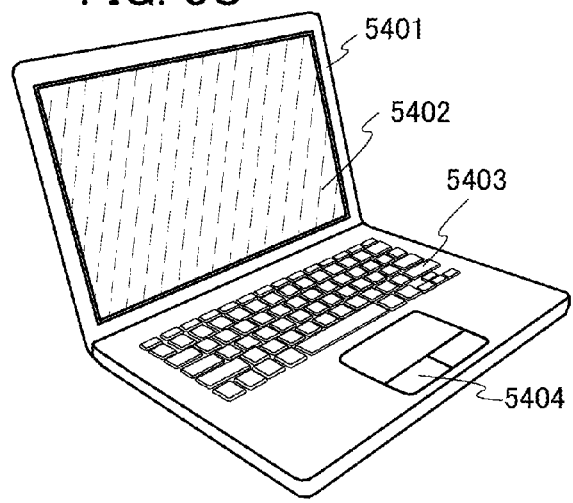

FIG. 8C illustrates a laptop, which includes a housing 5401, a display portion 5402, a keyboard 5403, a pointing device 5404, and the like.

Figure 8D:
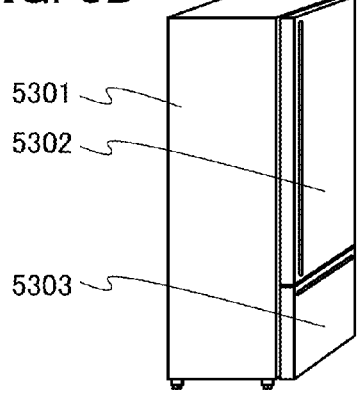

FIG. 8D illustrates an electric refrigerator-freezer, which includes a housing 5301, a refrigerator door 5302, a freezer door 5303, and the like.

Figure 8E:
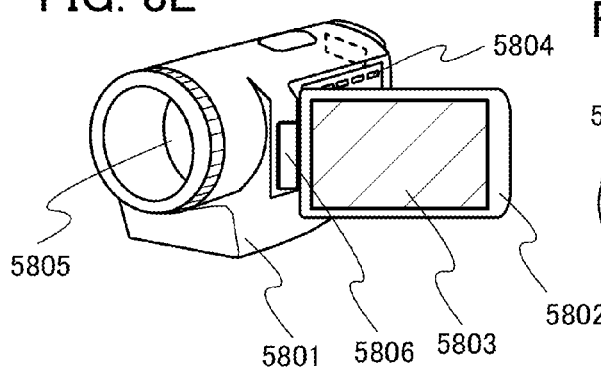

FIG. 8E illustrates a video camera, which includes a first housing 5801, a second housing 5802, a display portion 5803, operation keys 5804, a lens 5805, a joint 5806, and the like. The operation keys 5804 and the lens 5805 are provided in the first housing 5801, and the display portion 5803 is provided in the second housing 5802. The first housing 5801 and the second housing 5802 are connected to each other with the joint 5806, and an angle between the first housing 5801 and the second housing 5802 can be changed with the joint 5806. An image on the display portion 5803 may be switched depending on the angle between the first housing 5801 and the second housing 5802 at the joint 5806.

Figure 8F:
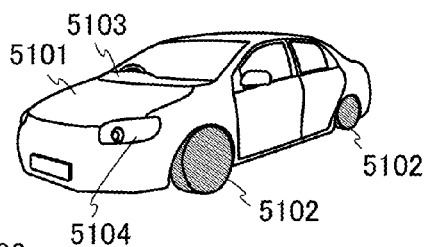

FIG. 8F illustrates an ordinary motor vehicle, which includes a car body 5101, wheels 5102, a dashboard 5103, lights 5104, and the like.

This embodiment can be combined with the other embodiment as appropriate.

EXPLANATION OF REFERENCE

Node_1: node, Node_2: node, Node_3: node, Node_4: node, P1: period, P2: period, P3: period, P4: period, 10: semiconductor device, 20: semiconductor device, 30: semiconductor device, 110: memory circuit portion, 120: memory circuit portion, 121: transistor, 122: capacitor, 123: transistor, 124: transistor, 125: transistor, 126: capacitor, 127: transistor, 128: transistor, 200: memory circuit portion, 201: inverter circuit, 202: inverter circuit, 203: switch, 204: inverter circuit, 205: switch, 220: memory circuit portion, 221: transistor, 222: capacitor, 223: transistor, 224: transistor, 225: transistor, 226: capacitor, 227: transistor, 228: transistor, 229: inverter circuit, 230: inverter circuit, 300: logic array, 301: LE, 302: switch portion, 303: wiring group, 304: wiring group, 305: input-output terminal, 311: LUT, 312: flip-flop, 313: multiplexer, 314: configuration memory, 315: configuration memory, 316: input terminal, 317: output terminal, 400: CPU, 401: main memory device, 411: program counter, 412: instruction register, 413: instruction decoder, 414: general-purpose register, 415: ALU, 421: power switch 422: power supply control circuit, 500: configuration memory, 501: data line, 502: word line, 503: word line, 511: transistor, 512: transistor, 513:

transistor, 514: capacitor, 520: configuration memory, 531: transistor, 532: transistor, 533: transistor, 534: capacitor, 535: transistor, 536: transistor, 537: transistor, 538: capacitor, 540: inverter circuit, 541: data line, 542: word line, 543: word line, 900: substrate, 901: transistor, 902: transistor, 904: well, 906: impurity region, 907: gate insulating film, 908: gate electrode layer, 909: sidewall insulating film, 910: insulating film, 911: insulating film, 912: insulating film, 913: contact plug, 914: wiring layer, 915: contact plug, 916: wiring layer, 917: contact plug, 918: wiring layer, 919: insulating film, 920: insulating film, 921: contact plug, 922: wiring layer, 923: back-gate electrode layer, 924: insulating film, 925: contact plug, 926: oxide semiconductor film, 927: source electrode layer, 928: drain electrode layer, 929: gate insulating film, 930: gate electrode layer, 932: insulating film, 933: insulating film, 5001: housing, 5002: housing, 5003: display portion, 5004: display portion, 5005: microphone, 5006: speaker, 5007: operation key, 5008: stylus, 5101: car body, 5102: wheel, 5103: dashboard, 5104: light, 5301: housing, 5302: refrigerator door, 5303: freezer door, 5401: housing, 5402: display portion, 5403: keyboard, 5404: pointing device, 5601: housing, 5602: housing, 5603: display portion, 5604: display portion, 5605: joint, 5606: operation key, 5801: housing, 5802: housing, 5803: display portion, 5804: operation key, 5805: lens, and 5806: joint.

This application is based on Japanese Patent Application serial no. 2012-244560 filed with Japan Patent Office on Nov. 6, 2012, the entire contents of which are hereby incorporated by reference.

The invention claimed is:

1. A semiconductor device comprising:
   a volatile memory;
   a first transistor;
   a second transistor;
   a third transistor; and
   a first capacitor,
   wherein a first terminal of the first transistor is electrically connected to the volatile memory,
   wherein a second terminal of the first transistor is electrically connected to a gate of the second transistor,
   wherein a first terminal of the second transistor is electrically connected to a first terminal of the third transistor,
   wherein a second terminal of the third transistor is electrically connected to the volatile memory, and
   wherein a first terminal of the first capacitor is electrically connected to the gate of the second transistor.

2. The semiconductor device according to claim 1, wherein the first transistor comprises a channel formation region comprising an oxide semiconductor.

3. The semiconductor device according to claim 1,
   wherein the volatile memory comprises a first inverter and a second inverter,
   wherein an input terminal of the first inverter and an output terminal of the second inverter are electrically connected to a first node,
   wherein an output terminal of the first inverter and an input terminal of the second inverter are electrically connected to a second node,
   wherein the first terminal of the first transistor is electrically connected to the first node, and
   wherein the second terminal of the third transistor is electrically connected to the second node.

4. The semiconductor device according to claim 1,
   wherein the volatile memory comprises a first inverter and a second inverter,
   wherein the semiconductor device comprises a third inverter,
   wherein an input terminal of the first inverter and an output terminal of the second inverter are electrically connected to a first node,
   wherein an output terminal of the first inverter and an input terminal of the second inverter are electrically connected to a second node,
   wherein the first terminal of the first transistor is electrically connected to the first node through the third inverter, and
   wherein the second terminal of the third transistor is electrically connected to the first node.

5. A semiconductor device comprising:
   a volatile memory;
   a first transistor;
   a second transistor;
   a third transistor;
   a fourth transistor;
   a fifth transistor;
   a sixth transistor;
   a first capacitor; and
   a second capacitor,
   wherein a first terminal of the first transistor is electrically connected to the volatile memory,
   wherein a second terminal of the first transistor is electrically connected to a gate of the second transistor,
   wherein a first terminal of the second transistor is electrically connected to a first terminal of the third transistor,
   wherein a second terminal of the third transistor is electrically connected to the volatile memory,
   wherein a first terminal of the fourth transistor is electrically connected to the volatile memory,
   wherein a second terminal of the fourth transistor is electrically connected to a gate of the fifth transistor,
   wherein a first terminal of the fifth transistor is electrically connected to a first terminal of the sixth transistor,
   wherein a second terminal of the sixth transistor is electrically connected to the volatile memory,
   wherein a first terminal of the first capacitor is electrically connected to the gate of the second transistor, and
   wherein a first terminal of the second capacitor is electrically connected to the gate of the fifth transistor.

6. The semiconductor device according to claim 5,
   wherein the first transistor comprises a channel formation region comprising an oxide semiconductor, and
   wherein the fourth transistor comprises a channel formation region comprising an oxide semiconductor.

7. The semiconductor device according to claim 5,
   wherein the volatile memory comprises a first inverter and a second inverter,
   wherein an input terminal of the first inverter and an output terminal of the second inverter are electrically connected to a first node,
   wherein an output terminal of the first inverter and an input terminal of the second inverter are electrically connected to a second node,
   wherein the first terminal of the first transistor is electrically connected to the first node,
   wherein the second terminal of the third transistor is electrically connected to the second node,
   wherein the first terminal of the fourth transistor is electrically connected to the second node, and
   wherein the second terminal of the sixth transistor is electrically connected to the first node.

8. The semiconductor device according to claim 5,
   wherein the volatile memory comprises a first inverter and a second inverter, wherein the semiconductor device comprises a third inverter and a fourth inverter, wherein an input terminal of the first inverter and an output terminal of the second inverter are electrically connected to a first node, wherein an output terminal of the first inverter and an input terminal of the second inverter are electrically connected to a second node, wherein the first terminal of the first transistor is electrically connected to the first node through the third inverter, wherein the second terminal of the third transistor is electrically connected to the first node, wherein the first terminal of the fourth transistor is electrically connected to the second node through the fourth inverter, and wherein the second terminal of the sixth transistor is electrically connected to the second node.

9. A method for driving a semiconductor device, the semiconductor device comprising:
   a volatile memory;
   a first transistor;
   a second transistor; and
   a third transistor,
   wherein a first terminal of the first transistor is electrically connected to the volatile memory,
   wherein a second terminal of the first transistor is electrically connected to a gate of the second transistor,
   wherein a first terminal of the second transistor is electrically connected to a first terminal of the third transistor,
   wherein a second terminal of the third transistor is electrically connected to the volatile memory, and
   wherein the method for driving the semiconductor device comprises the steps of:
   supplying a first control signal to a gate of the first transistor to supply charge corresponding to data of the volatile memory to the gate of the second transistor;
   supplying no power supply voltage to the volatile memory;
   holding the charge corresponding to the data during the supplying no power supply voltage to the volatile memory;
   supplying power supply voltage to the volatile memory; and
   supplying a second control signal to a gate of the third transistor to load the data to the volatile memory.

10. The method for driving the semiconductor device according to claim 9, wherein the first transistor comprises a channel formation region comprising an oxide semiconductor.

11. The method for driving the semiconductor device according to claim 9,
    wherein the volatile memory comprises a first inverter and a second inverter,
    wherein an input terminal of the first inverter and an output terminal of the second inverter are electrically connected to a first node,
    wherein an output terminal of the first inverter and an input terminal of the second inverter are electrically connected to a second node,
    wherein the first terminal of the first transistor is electrically connected to the first node, and
    wherein the second terminal of the third transistor is electrically connected to the second node.

12. The method for driving the semiconductor device according to claim 9,
    wherein the volatile memory comprises a first inverter and a second inverter, wherein the semiconductor device comprises a third inverter, wherein an input terminal of the first inverter and an output terminal of the second inverter are electrically connected to a first node, wherein an output terminal of the first inverter and an input terminal of the second inverter are electrically connected to a second node, wherein the first terminal of the first transistor is electrically connected to the first node through the third inverter, and wherein the second terminal of the third transistor is electrically connected to the first node.

13. The method for driving the semiconductor device according to claim 9,
    wherein the semiconductor device comprises a first capacitor, and
    wherein a first terminal of the first capacitor is electrically connected to the gate of the second transistor.

14. The method for driving the semiconductor device according to claim 9,
    wherein the semiconductor device comprises:
    a fourth transistor;
    a fifth transistor; and
    a sixth transistor,
    wherein a first terminal of the fourth transistor is electrically connected to the volatile memory,
    wherein a second terminal of the fourth transistor is electrically connected to a gate of the fifth transistor,
    wherein a first terminal of the fifth transistor is electrically connected to a first terminal of the sixth transistor,
    wherein a second terminal of the sixth transistor is electrically connected to the volatile memory, and
    wherein the method for driving the semiconductor device comprises the steps of:
    supplying the first control signal to the gate of the first transistor and a gate of the fourth transistor to supply the charge corresponding to the data to the gate of the second transistor and the gate of the fifth transistor;
    supplying no power supply voltage to the volatile memory;
    holding the charge corresponding to the data during the supplying no power supply voltage to the volatile memory;
    supplying power supply voltage to the volatile memory; and
    supplying the second control signal to the gate of the third transistor and a gate of the sixth transistor to load the data to the volatile memory.

15. The method for driving the semiconductor device according to claim 14,
    wherein the first transistor comprises a channel formation region comprising an oxide semiconductor, and
    wherein the fourth transistor comprises a channel formation region comprising an oxide semiconductor.

16. The method for driving the semiconductor device according to claim 14,
    wherein the volatile memory comprises a first inverter and a second inverter,
    wherein an input terminal of the first inverter and an output terminal of the second inverter are electrically connected to a first node,
    wherein an output terminal of the first inverter and an input terminal of the second inverter are electrically connected to a second node,
    wherein the first terminal of the first transistor is electrically connected to the first node, wherein the second terminal of the third transistor is electrically connected to the second node, wherein the first terminal of the fourth transistor is electrically connected to the second node, and wherein the second terminal of the sixth transistor is electrically connected to the first node.

17. The method for driving the semiconductor device according to claim 14, wherein the volatile memory comprises a first inverter and a second inverter, wherein the semiconductor device comprises a third inverter and a fourth inverter, wherein an input terminal of the first inverter and an output terminal of the second inverter are electrically connected to a first node, wherein an output terminal of the first inverter and an input terminal of the second inverter are electrically connected to a second node, wherein the first terminal of the first transistor is electrically connected to the first node through the third inverter, wherein the second terminal of the third transistor is electrically connected to the first node, wherein the first terminal of the fourth transistor is electrically connected to the second node through the fourth inverter, and wherein the second terminal of the sixth transistor is electrically connected to the second node.

18. The method for driving the semiconductor device according to claim 14, wherein the semiconductor device comprises a first capacitor and a second capacitor, wherein a first terminal of the first capacitor is electrically connected to the gate of the second transistor, and wherein a first terminal of the second capacitor is electrically connected to the gate of the fifth transistor.

* * * * *